(12) United States Patent
Naito

(10) Patent No.: US 11,139,392 B2
(45) Date of Patent: Oct. 5, 2021

(54) SEMICONDUCTOR DEVICE AND MANUFACTURING METHOD

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/882,527

(22) Filed: May 24, 2020

(65) Prior Publication Data

US 2020/0287031 A1    Sep. 10, 2020

Related U.S. Application Data

(63) Continuation of application No. PCT/JP2019/022804, filed on Jun. 7, 2019.

(30) Foreign Application Priority Data

Jun. 21, 2018   (JP) .............................. JP2018-117706

(51) Int. Cl.
*H01L 29/739* (2006.01)
*H01L 21/265* (2006.01)
(Continued)

(52) U.S. Cl.
CPC ........ *H01L 29/7397* (2013.01); *H01L 21/265* (2013.01); *H01L 21/324* (2013.01); *H01L 29/1095* (2013.01); *H01L 29/6634* (2013.01)

(58) Field of Classification Search
CPC ............. H01L 29/7397; H01L 29/1095; H01L 29/6634; H01L 29/36
See application file for complete search history.

(56) References Cited

U.S. PATENT DOCUMENTS 10,002,952 B2    6/2018  Sugahara
10,236,368 B2    3/2019  Higasa
(Continued)

FOREIGN PATENT DOCUMENTS

JP    2007266133 A    10/2007
JP    2010050307 A    3/2010
(Continued)

OTHER PUBLICATIONS (ISA/237) Written Opinion of the International Search Authority for International Patent Application No. PCT/JP2019/022804, issued/mailed by the Japan Patent Office dated Mar. 9, 2019.

*Primary Examiner* — Joseph C. Nicely

(57) ABSTRACT

Provided is a semiconductor device, wherein at least one mesa portion contacting a gate trench portion thereof comprises: a first conductivity type emitter region with a doping concentration higher than a drift region, exposed on the top of the substrate and contacting the gate trench portion; a second conductivity type base region under the emitter region, contacting the trench portion, having a first peak in a doping concentration distribution in a depth direction of the substrate; a first conductivity type accumulation region under the base region, having a doping concentration higher than the drift region; and a second conductivity type intermediate region at a depth position between the base region and the accumulation region, having at least one of a second peak and a kink portion from the first peak to a depth position of a bottom of the trench portion in the doping concentration distribution in the depth direction.

22 Claims, 20 Drawing Sheets

(51) Int. Cl.
*H01L 21/324* (2006.01)
*H01L 29/10* (2006.01)
*H01L 29/66* (2006.01)

(56) References Cited

U.S. PATENT DOCUMENTS

| | | | |
|---|---|---|---|
| 2018/0040690 A1 | 2/2018 | Kobayashi | |
| 2018/0350961 A1 | 12/2018 | Naito | |
| 2019/0287961 A1* | 9/2019 | Naito | ................. H01L 29/1079 |
| 2020/0251581 A1* | 8/2020 | Naito | ................. H01L 29/0804 |
| 2020/0388611 A1* | 12/2020 | Onozawa | ............ H01L 21/2652 |

FOREIGN PATENT DOCUMENTS

| | | | |
|---|---|---|---|
| JP | 2016164952 A | 9/2016 |
| JP | 2017183346 A | 10/2017 |
| JP | 2018019046 A | 2/2018 |
| JP | 2018022852 A | 2/2018 |
| WO | 2018030440 A1 | 2/2018 |

* cited by examiner

SEMICONDUCTOR DEVICE AND MANUFACTURING METHOD

The contents of the following Japanese patent applications are incorporated herein by reference:
NO. 2018-117706 filed in JP on Jun. 21, 2018, and
NO. PCT/JP2019/022804 filed on Jun. 7, 2019.

BACKGROUND

1. Technical Field

The invention relates to a semiconductor device and a manufacturing method.

2. Related Art

Conventionally, a semiconductor device equipped with a gate trench has been known (for example, see Patent Literatures 1 and 2). When a predetermined voltage is applied to the gate trench, a channel is formed in a longitudinal direction in a P type region in contact with the gate trench.
Patent Literature 1: Japanese Unexamined Patent Publication No. 2018-19046
Patent Literature 2: Japanese Unexamined Patent Publication No. 2017-183346
In the semiconductor device, it is preferable to suppress a short channel effect in which the length of an effective channel is shortened.

SUMMARY

In a first aspect of the present invention, a semiconductor device is provided which includes a semiconductor substrate having a drift region of the first conductivity type. The semiconductor device may include a plurality of trench portions which are provided from an upper surface of the semiconductor substrate up to the drift region, and arranged in an arranging direction in the upper surface of the semiconductor substrate. The semiconductor device may include a mesa portion which is a region interposed by two of the trench portions in the semiconductor substrate. The trench portion may include one or more gate trench portions and one or more dummy trench portions. At least one mesa portion in contact with the gate trench portion may include an emitter region, having a first conductivity type of a doping concentration higher than the drift region, which is provided to be exposed to the upper surface of the semiconductor substrate and to be in contact with the gate trench portion. The mesa portion may include a base region, having a second conductivity type, which is provided on a lower side of the emitter region and in contact with the gate trench portion. The mesa portion may include an accumulation region, having the first conductivity type of a doping concentration higher than the drift region, which is provided on a lower side of the base region. The mesa portion may include an intermediate region, having the second conductivity type, which is provided at a depth position between an upper end of the base region and a lower end of the accumulation region. The base region may have a first peak in a doping concentration distribution in a depth direction of the semiconductor substrate. The intermediate region may have at least one of a second peak and a kink portion from the first peak to a depth position of a lower end of the trench portion in a doping concentration distribution in the depth direction.

At a depth position where the intermediate region is provided, a doping concentration of a dopant of the second conductivity type of a center of the mesa portion in the arranging direction may be higher than a doping concentration of a dopant of the second conductivity type at a position in contact with the trench portion.

The intermediate region may have the second peak. The accumulation region may have one or more peaks in the doping concentration distribution in the depth direction of the semiconductor substrate. The second peak may be disposed on an upper side from the peak on a lowermost side of the accumulation region.

The second peak may be disposed on an upper side from the peak on an uppermost side of the accumulation region.

In a boundary between the base region and the accumulation region, a depth position of a portion in contact with the gate trench portion may be within a half-width range of the doping concentration distribution of the intermediate region with reference to a depth position of the second peak.

At least a part of the intermediate region may be provided on an upper side from a depth position of a portion in contact with the gate trench portion in a boundary between the base region and the accumulation region.

A doping concentration of the second peak may be higher than a doping concentration of the first peak.

A doping concentration of the second peak may be higher than a doping concentration of the accumulation region.

The doping concentration distribution in the depth direction on the lower side from the second peak of the intermediate region may be more steeply changed than the doping concentration distribution in the depth direction on the lower side from the first peak of the base region.

The intermediate region may be disposed apart from the gate trench portion.

The intermediate region may be disposed in contact with the gate trench portion. A doping concentration of the second peak at a position in contact with the gate trench portion may be lower than a doping concentration of the first peak.

The mesa portion may be provided to be extended in an extending direction orthogonal to the arranging direction in the upper surface of the semiconductor substrate. The mesa portion may include a contact region of the second conductivity type of a doping concentration higher than the base region, which is disposed to be exposed to the upper surface of the semiconductor substrate alternately with the emitter region in the extending direction. The intermediate region may be disposed to be overlapped with at least a partial range of the emitter region in the extending direction, and not to be overlapped with at least a partial range of the contact region in the extending direction.

A length of the intermediate region in the extending direction may be longer than a length of the emitter region in the extending direction.

In the semiconductor substrate, the contact region and the intermediate region may be disposed apart from each other.

In addition, in the semiconductor substrate, the emitter region and the intermediate region may be disposed apart from each other.

At least a part of the intermediate region may be disposed in the mesa portion which is interposed by the gate trench portion and the dummy trench portion. The intermediate region may be disposed apart from the dummy trench portion.

A second aspect of the invention provides a manufacturing method for manufacturing the semiconductor device according to the first aspect. The manufacturing method may include a first implantation step to implant a dopant of the second conductivity type to the semiconductor substrate having the drift region. The manufacturing method may include a first annealing step to anneal the semiconductor substrate to form the base region. The manufacturing method may include a second implantation step to implant a dopant of the second conductivity type to the semiconductor substrate after the first annealing step. The manufacturing method may include a second annealing step to anneal the semiconductor substrate at a temperature lower than the first annealing step to form the intermediate region.

An annealing time of the second annealing step may be shorter than an annealing time of the first annealing step.

The manufacturing method may include a step to form the accumulation region, between the first annealing step and the second implantation step, in which a dopant of the first conductivity type is implanted to the semiconductor substrate to anneal the semiconductor substrate.

The summary clause does not necessarily describe all necessary features of the embodiments of the present invention. The present invention may also be a sub-combination of the features described above.

DESCRIPTION OF EXEMPLARY EMBODIMENTS

Hereinafter, the invention will be described through embodiments of the invention, but the following embodiments do not limit the invention according to claims. In addition, not all combinations of the features described in the embodiments are necessarily essential to the solution of the invention.

In this specification, one side in a direction parallel to the depth direction of a semiconductor substrate is referred to as "upper", and the other side is referred to as "lower". One of the two main surfaces of the substrate, layer, or other members is called an upper surface, and the other surface is called a lower surface. The directions of "up" and "down" are not limited to the direction of gravity or the direction of attachment to the substrate or the like when a semiconductor device is mounted.

In this specification, technical matters may be described using orthogonal coordinate axes of an X axis, a Y axis, and a Z axis. In this specification, a plane parallel to the upper surface of the semiconductor substrate is defined as an XY plane, and a depth direction perpendicular to the upper surface of the semiconductor substrate is defined as a Z-axis.

In each embodiment, a first conductivity type is exemplified as an N type, and a second conductivity type is exemplified as a P type. However, the first conductivity type may be the P type, and the second conductivity type may be the N type. In this case, the conductivity types of the substrate, layer, region, and the like in each embodiment have opposite polarities. In addition, in this specification, a P+ type (or N+ type) means that the doping concentration is higher than the P type (or N type), and a P− type (or N− type) means that the doping concentration is lower than the P type (or N type).

In this specification, the term "doping concentration" refers to the concentration of a donor or an acceptorized dopant. In this specification, a concentration difference between the donor and the acceptor (that is, a net doping concentration) may be used as the doping concentration. In this case, the doping concentration can be measured in an SR method. In addition, a chemical concentration of the donor and the acceptor may be the doping concentration. In this case, the doping concentration can be measured by a SIMS method. If not particularly limited, any of the above may be used as the doping concentration. If not particularly limited, a peak value of the doping concentration distribution in a doping region may be used as the doping concentration in the doping region.

Figure 1:
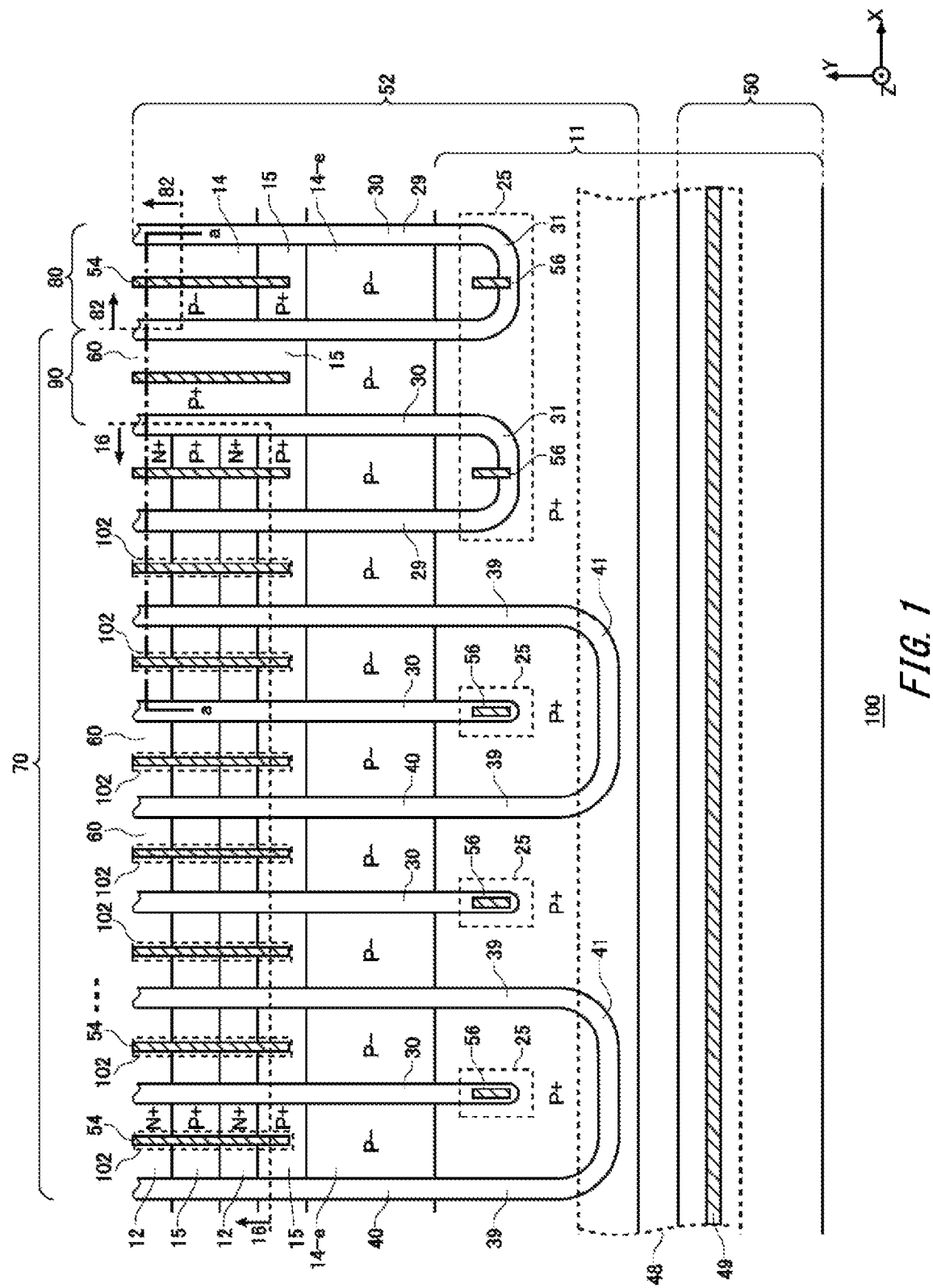
FIG. 1 is a diagram partially illustrating an upper surface of a semiconductor device 100 according to an embodiment of the invention.

FIG. 1 is a diagram partially illustrating the upper surface of a semiconductor device 100 according to an embodiment of the invention. The semiconductor device 100 of this example is a semiconductor chip which includes a transistor portion 70 including a transistor such as an insulated gate bipolar transistor (IGBT) and a diode portion 80 including a diode such as a Free Wheeling Diode (FWD). The diode portions 80 are provided on the upper surface of the semiconductor substrate in a predetermined arranging direction with the transistor portion 70. In this specification, the arranging direction is an X axis direction. As an example, the transistor portion 70 and the diode portion 80 are provided alternately in the X axis direction. In FIG. 1, the chip upper surface around a chip end portion is illustrated, and the other regions are omitted.

The diode portion 80 is a region where a cathode region 82 is provided on the lower surface side of the semiconductor substrate. The cathode region 82 is exposed on the lower surface side of the semiconductor substrate, and is in contact with an electrode provided in the lower surface of the semiconductor substrate. In this specification, a region overlapped with the cathode region 82 in a Z axis direction is referred to as the diode portion 80. In other words, a projection region when the cathode region 82 is projected onto the upper surface of the semiconductor substrate in a direction perpendicular to the lower surface of the semiconductor substrate is referred to as a diode portion 80. In addition, an extension region obtained by extending the projection region up to the end of an active region in a Y axis direction may also be referred to as the diode portion 80. The active region will be described below. The Y axis direction is a direction perpendicular to both the X axis direction and the Z axis direction. The diode portion 80 may refer to a region in which the second conductivity type region is provided on the upper surface of the semiconductor substrate in the projection region and the extension region.

The transistor portion 70 may refer to a region other than the diode portion 80 in the active region. The transistor portion 70 includes a collector region of the second conductivity type which is exposed to the lower surface of the semiconductor substrate. The transistor portion 70 is a projection region when the collector region is projected onto the upper surface of the semiconductor substrate, and may refer to a region where a predetermined unit configuration including an emitter region 12 and a contact region 15 described later is regularly arranged.

FIG. 1 illustrates the active region of the semiconductor substrate in the semiconductor device 100. The active region indicates a region where a current flows between the upper surface and the lower surface of the semiconductor substrate in a case where the semiconductor device 100 is controlled to an ON state. For example, the active region is a region surrounding a gate metal layer 50 illustrated in FIG. 1.

The semiconductor device 100 may include an edge termination structure which surrounds the active region. For example, the edge termination structure is provided on the end portion side of the semiconductor substrate from the gate metal layer 50 illustrated in FIG. 1. The edge termination structure relaxes an electrical field concentration on the upper surface side of the semiconductor substrate. The edge termination structure has, for example, a guard ring, a field plate, a Resurf, and a combination thereof.

The semiconductor device 100 of this example includes a gate trench portion 40, a dummy trench portion 30, a well region 11, the emitter region 12, a base region 14, and the contact region 15 inside on the upper surface side of the semiconductor substrate. The gate trench portion 40 and the dummy trench portion 30 each are an example of the trench portion. In addition, the semiconductor device 100 of this example includes an emitter electrode 52 and the gate metal layer 50 which are provided on the upper side of the upper surface of the semiconductor substrate. The emitter electrode 52 and the gate metal layer 50 are provided to be separated from each other.

An interlayer dielectric film is provided between the emitter electrode 52 and the gate metal layer 50 and in a space with respect to the upper surface of the semiconductor substrate, but is omitted in FIG. 1. In the interlayer dielectric film of this example, a contact hole 56, a contact hole 49, and a contact hole 54 are provided to pass through the interlayer dielectric film. In FIG. 1, the respective contact holes are hatched with diagonal lines.

The emitter electrode 52 is provided on the upper side of the gate trench portion 40, the dummy trench portion 30, the well region 11, the emitter region 12, the base region 14, and the contact region 15. The emitter electrode 52 is in contact with the emitter region 12, the contact region 15, and the base region 14 in the upper surface of the semiconductor substrate through the contact hole 54. In addition, the emitter electrode 52 is connected to a dummy conductive portion in the dummy trench portion 30 through the contact hole 56. Between the emitter electrode 52 and the dummy conductive portion, a connection portion 25 made of a conductive material such as polysilicon doped with impurities may be provided. The connection portion 25 is provided in the upper surface of the semiconductor substrate. Between the connection portion 25 and the semiconductor substrate, an insulating film such as a thermal oxide film is provided.

The gate metal layer 50 applies a gate voltage to the transistor portion 70. The gate metal layer 50 may be connected to a gate pad which is provided on the upper side of the upper surface of the semiconductor substrate. The gate pad is connected to an external device by a wire or the like. The gate metal layer 50 may be provided to surround the active region in top view. As an example, the gate metal layer 50 is provided in an annular shape along the outer periphery of the semiconductor substrate in top view.

The gate metal layer 50 is in contact with a gate runner 48 through the contact hole 49. The gate runner 48 is formed of polysilicon doped with impurities. Between the gate runner 48 and the semiconductor substrate, an insulating film such as the thermal oxide film is provided. The gate runner 48 is connected to a gate conductive portion in the gate trench portion 40 in the upper surface of the semiconductor substrate. The gate runner 48 is not connected to the dummy conductive portion in the dummy trench portion 30. The gate runner 48 of this example is provided from a position overlapped with the contact hole 49 to a position overlapped with an edge portion 41 of the gate trench portion 40. The edge portion 41 is an end portion nearest to the gate metal layer 50 in the gate trench portion 40. In the edge portion 41 of the gate trench portion 40, the gate conductive portion is exposed to the upper surface of the semiconductor substrate, and is in contact with the gate runner 48.

The emitter electrode 52 and the gate metal layer 50 are formed of a material containing metal. For example, at least a part of region of each electrode is formed of aluminum or an aluminum-silicon alloy. Each electrode may have a barrier metal formed of titanium, a titanium compound, or the like in a lower layer of the region formed of aluminum or the like. Further, a plug formed by burying tungsten or the like in contact with the barrier metal and aluminum or the like may be provided in the contact hole.

The well region 11 is provided so as to be overlapped with the gate metal layer 50 and the gate runner 48. The well region 11 is provided so as to extend with a predetermined width even in a range not overlapped with the gate metal layer 50 and the gate runner 48. The well region 11 of this example is provided apart from the end of the contact hole 54 in the Y axis direction toward the gate metal layer 50. The well region 11 is a region of the second conductivity type having a doping concentration higher than the base region 14. The base region 14 of this example is a P− type, and the well region 11 is a P+ type.

Each of the transistor portion 70 and the diode portion 80 includes a plurality of trench portions arranged in the arranging direction. In the transistor portion 70 of this example, one or more gate trench portions 40 and one or more dummy trench portions 30 are provided alternately along the arranging direction. In the diode portion 80 of this example, a plurality of dummy trench portions 30 are provided along the arranging direction. In the diode portion 80 of this example, the gate trench portion 40 is not provided.

The gate trench portion 40 of this example may include two extension portions 39 (a trench portion of a linear shape along the extending direction) extending along the extending direction perpendicular to the arranging direction, and the edge portion 41 connecting the two extension portions 39. The extending direction in FIG. 1 is the Y axis direction.

At least a part of the edge portion 41 is desirably provided in a curved shape in top view. The end portions of the two extension portions 39 in the Y axis direction are connected to the edge portion 41, so that the electrical field concentration in the end portion of the extension portion 39 can be relaxed.

In the transistor portion 70, the dummy trench portion 30 is provided between the extension portions 39 of the gate trench portion 40. One dummy trench portion 30 may be provided between the extension portions 39, or a plurality of dummy trench portions 30 may be provided. The dummy trench portion 30 may be formed in a linear shape extending in the extending direction, or may include an extension portion 29 and an edge portion 31 similarly to the gate trench portion 40. The semiconductor device 100 illustrated in FIG. 1 includes both the linear dummy trench portion 30 having no edge portion 31, and the dummy trench portion 30 having the edge portion 31.

The diffusion depth of the well region 11 may be deeper than the depth of the gate trench portion 40 and the dummy trench portion 30. The end portions of the gate trench portion 40 and the dummy trench portion 30 in the Y axis direction are provided in the well region 11 in top view. That is, in the end portion of each trench portion in the Y axis direction, the bottom of each trench in the depth direction is covered by the well region 11. In this specification, the depth direction may be referred to as the Z axis direction. With this configuration, the electrical field concentration in the bottom of each trench portion can be relaxed.

A mesa portion 60 is provided between trench portions in the arranging direction. The mesa portion 60 indicates a region interposed the trench portions in the semiconductor substrate. As an example, the upper end of the mesa portion is the upper surface of the semiconductor substrate. A depth position of the lower end of the mesa portion is the same as the depth position of the lower end of the trench portion. The mesa portion 60 of this example is provided to extend in the extending direction (Y axis direction) along the trench in the upper surface of the semiconductor substrate.

In each mesa portion 60, the base region 14 is provided. In the base region 14 exposed to the upper surface of the semiconductor substrate in the mesa portion 60, the region disposed nearest to the gate metal layer 50 is referred to as a base region 14-e. In FIG. 1, the base region 14-e disposed in one end portion of each mesa portion 60 in the extending direction is illustrated, but the base region 14-e is disposed even in the other end of each mesa portion 60. In each mesa portion 60, at least one of the emitter region 12 of the first conductivity type and the contact region 15 of the second conductivity type may be provided in the region interposed by the base regions 14-e in top view. The emitter region 12 of this example is an N+ type, and the contact region 15 is a P+ type. The emitter region 12 and the contact region 15 may be provided between the base region 14 and the upper surface of the semiconductor substrate in the depth direction.

In the mesa portion 60 of the transistor portion 70, the mesa portion 60 in contact with the gate trench portion 40 includes the emitter region 12 which is exposed to the upper surface of the semiconductor substrate. The emitter region 12 is provided in contact with the gate trench portion 40. The mesa portion 60 in contact with the gate trench portion 40 may be provided with the contact region 15 which is exposed to the upper surface of the semiconductor substrate.

Each of the contact region 15 and the emitter region 12 is provided from one trench portion to the other trench portion in the X axis direction. As an example, the contact region 15 and the emitter region 12 of the mesa portion 60 in contact with the gate trench portion 40 are alternately disposed along the extending direction (Y axis direction) of the trench portion.

In another example, the contact region 15 and the emitter region 12 of the mesa portion 60 in contact with the gate trench portion 40 may be provided in a strip shape along the extending direction (Y axis direction) of the trench portion. For example, the emitter region 12 is provided in the region in contact with the trench portion, and the contact region 15 is provided in the region interposed by the emitter regions 12.

In the mesa portion 60 of the transistor portion 70, the mesa portion 60 interposed by two dummy trench portions 30 may be provided with the emitter region 12, or may not be. In this example, in the mesa portion 60 interposed by the two dummy trench portions 30 in the transistor portion 70, the emitter region 12 and the contact region 15 are provided in the mesa portion 60 other than a boundary portion 90 which his disposed in the boundary with respect to the diode portion 80. The arrangement of the emitter region 12 and the contact region 15 in the mesa portion 60 interposed by the two dummy trench portions 30 may be the same as the arrangement of the emitter region 12 and the contact region 15 in the mesa portion 60 in contact with the gate trench portion 40.

In this specification, a boundary region with respect to the diode portion 80 in the arranging direction in the transistor portion 70 is referred to as the boundary portion 90. In the boundary portion 90, one or more mesa portions 60 are included. In the upper surface of the mesa portion 60 of the boundary portion 90, the contact region 15 is provided, and the emitter region 12 is not provided. The area of the contact region 15 provided in the upper surface of one mesa portion 60 of the boundary portion 90 is larger than the area of the contact region 15 provided in the upper surface of one mesa portion 60 in contact with the gate trench portion 40. In the upper surface of the mesa portion 60 of the boundary portion 90 of this example, the contact region 15 is provided in the entire region interposed by the base regions 14-e in top view. The mesa portion 60 of the boundary portion 90 has a function of extracting carriers such as holes toward the emitter electrode 52 such as when the transistor portion 70 is turned off.

In the mesa portion 60 of the diode portion 80, the emitter region 12 may be not provided. In the upper surface of the mesa portion 60 of the diode portion 80, the base region 14 and the contact region 15 may be provided. In the region interposed by the base regions 14-e in the upper surface of the mesa portion 60 of the diode portion 80, the contact region 15 may be provided in contact with each base region 14-e. In the region interposed by the contact regions 15 in the upper surface of the mesa portion 60 of the diode portion 80, the base region 14 may be provided. The base region 14 may be disposed in the entire region interposed by the contact regions 15.

On the upper side of each mesa portion 60, the contact hole 54 is provided. The contact hole 54 is disposed in the region interposed by the base regions 14-e. The contact hole 54 of this example is provided on the upper side of each region of the contact region 15, the base region 14, and the emitter region 12. The contact hole 54 is not provided in the region corresponding to the base region 14-e and the well region 11. The contact hole 54 may be disposed at the center in the arranging direction (X axis direction) of the mesa portion 60.

In the diode portion 80, the N+ type cathode region 82 is provided in the region adjacent to the lower surface of the semiconductor substrate. In FIG. 1, the region provided with the cathode region 82 is illustrated with a dotted line. In the region where the cathode region 82 is not provided in the region adjacent to the lower surface of the semiconductor substrate, the P+ type collector region may be provided.

In at least a part of the region of the transistor portion 70, an N+ type accumulation region 16 is provided. In FIG. 1, the region provided with the accumulation region 16 is illustrated with a dotted line. The accumulation region 16 may be provided on the lower side from the emitter region 12 and the contact region 15 in each mesa portion 60.

At least one mesa portion 60 in contact with the gate trench portion 40 includes an intermediate region 102 of the second conductivity type (the second conductivity type of this example is a P type). The intermediate region 102 is not exposed to the upper surface of the mesa portion 60. The intermediate region 102 of this example is provided at a position deeper than the emitter region 12 with the upper surface of the semiconductor substrate as a reference.

The intermediate region 102 may be provided in the entire mesa portion 60 in contact with the gate trench portion 40. The intermediate region 102 may be provided even at least one mesa portion 60 interposed by two dummy trench portions 30. In the example of FIG. 1, the intermediate region 102 is not provided in the mesa portions 60 of the boundary portion 90 and the diode portion 80, but in another example, the intermediate region 102 may be provided even in at least one of the mesa portions 60 of the boundary portion 90 and the diode portion 80.

As an example, the intermediate region 102 may be provided in at least one mesa portion 60 of the boundary portion 90, and the intermediate region 102 may be not provided in the diode portion 80. As an example, the intermediate region 102 may be provided in at least one mesa portion 60 of the diode portion 80, and the intermediate region 102 may be not provided in the boundary portion 90. As an example, the intermediate region 102 may be provided in all the mesa portions 60 of the semiconductor device 100. However, the arrangement of the intermediate regions 102 is not limited to these examples.

The intermediate region 102 may be disposed in a range containing the center of the mesa portion 60 in the arranging direction (X axis direction). The center of the intermediate region 102 in the arranging direction and the center of the mesa portion 60 may be overlapped, or may be not overlapped. The intermediate region 102 may be disposed to be overlapped with the contact hole 54. The intermediate region 102 may be continuously provided with almost the same length as the contact hole 54 in the extending direction (Y axis direction), or the intermediate region 102 having a length shorter than the contact hole 54 may be discretely provided in the extending direction. The semiconductor device 100 includes the intermediate region 102 to suppress a short channel effect. The suppressing of the short channel effect will be described below.

Figure 2:
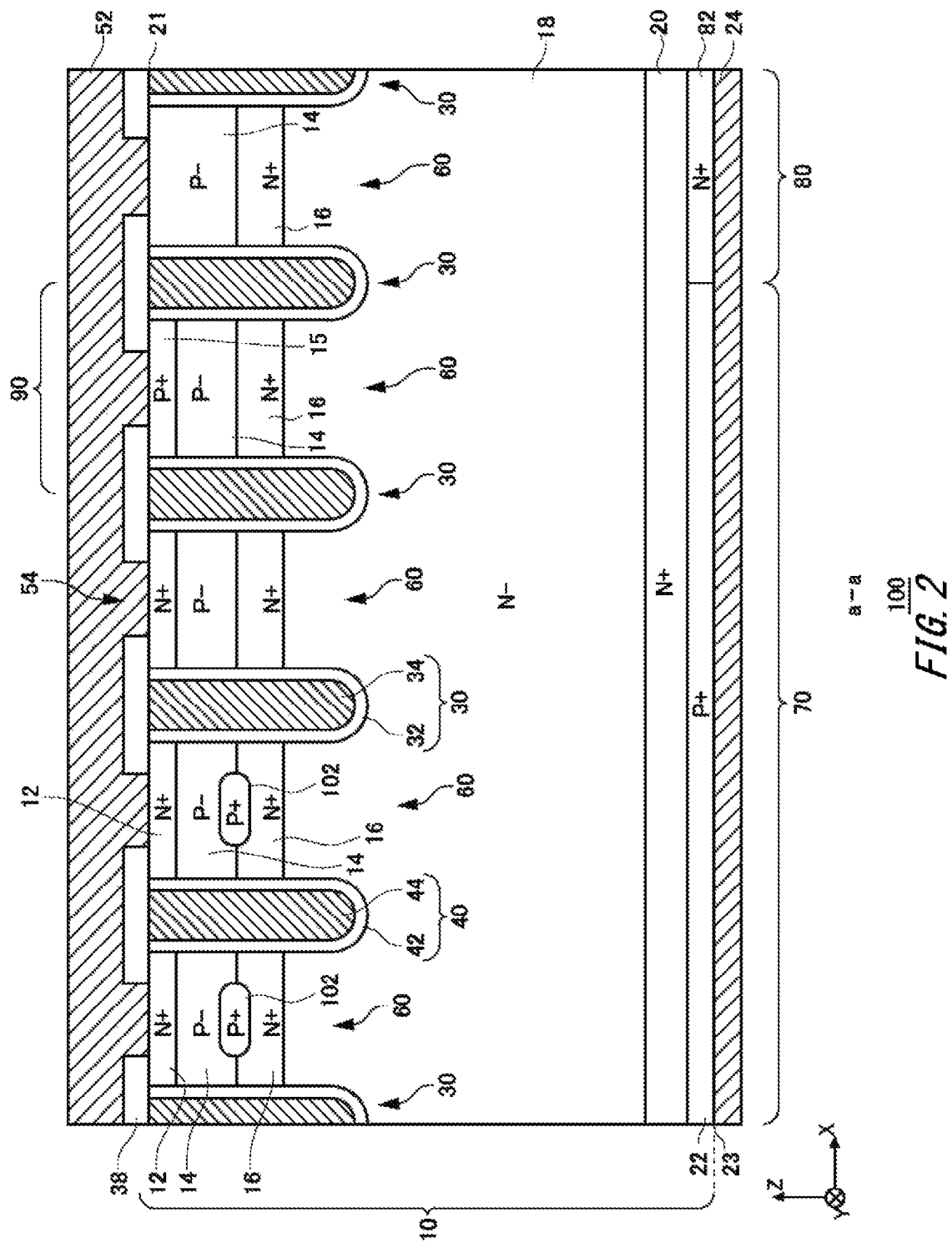
FIG. 2 is a diagram illustrating an example of a cross section taken along a line a-a in FIG. 1.

FIG. 2 is a diagram illustrating an example of a cross section taken along a line a-a in FIG. 1. The a-a cross section is an XZ plane passing through the emitter region 12 and the cathode region 82. The semiconductor device 100 of this example includes a semiconductor substrate 10, an interlayer dielectric film 38, the emitter electrode 52, and a collector electrode 24 in the cross section. The interlayer dielectric film 38 is provided in the upper surface of the semiconductor substrate 10. The interlayer dielectric film 38 is an insulating film such as silicate glass to which impurities such as boron or phosphorus are added. The interlayer dielectric film 38 may be in contact with the upper surface of the semiconductor substrate 10, or may be provided with another film such as an oxide film between the interlayer dielectric film 38 and the semiconductor substrate 10. In the interlayer dielectric film 38, the contact holes 54, 49, and 56 described in FIG. 1 are provided. In FIG. 2, the contact hole 54 is illustrated.

The emitter electrode 52 is provided on the upper side of the interlayer dielectric film 38. The emitter electrode 52 passes through the contact hole 54 of the interlayer dielectric film 38 and is in contact with an upper surface 21 of the semiconductor substrate 10. The collector electrode 24 is provided in a lower surface 23 of the semiconductor substrate 10. The emitter electrode 52 and the collector electrode 24 are formed of a conductive material such as metal or the like. In this specification, a direction (Z axis direction) connecting the emitter electrode 52 and the collector electrode 24 is referred to as a depth direction.

The semiconductor substrate 10 may be a silicon substrate, a silicon carbide substrate, or a nitride semiconductor substrate such as gallium nitride. The semiconductor substrate 10 of this example is a silicon substrate. The semiconductor substrate 10 includes an N− type drift region 18. The drift region 18 is provided in both of the transistor portion 70 and the diode portion 80.

In the transistor portion 70 other than the boundary portion 90, the N+ type emitter region 12, the P− type base region 14, and the N+ type accumulation region 16 are sequentially provided in the mesa portion 60 from the upper surface 21 of the semiconductor substrate 10.

The emitter region 12 is provided to be exposed to the upper surface 21 of the semiconductor substrate 10, and to be in contact with the gate trench portion 40. The emitter region 12 may be in contact with the trench portions on both sides of the mesa portion 60. The emitter region 12 has a doping concentration higher than the drift region 18.

The base region 14 is provided on the lower side of the emitter region 12. The base region 14 of this example is provided in contact with the emitter region 12. The base region 14 may be in contact with the trench portions on both sides of the mesa portion 60.

The accumulation region 16 is provided on the lower side of the base region 14. The accumulation region 16 of this example is provided between the base region 14 and the drift region 18. The accumulation region 16 is a region where the same dopant as that of the drift region 18 is accumulated with a higher concentration than the drift region 18, and has a higher doping concentration than the drift region 18. With the highly-concentrated accumulation region 16 between the drift region 18 and the base region 14, a carrier injection-enhancement effect (IE effect) is increased, and an ON voltage can be reduced. The accumulation region 16 may be provided to cover the entire lower surface of the base region 14 in each mesa portion 60.

In the mesa portion 60 of the boundary portion 90, the P+ type contact region 15, the P− type base region 14, and the N+ type accumulation region 16 are sequentially provided from the upper surface 21 of the semiconductor substrate 10. The base region 14 and the accumulation region 16 are the same as the base region 14 and the accumulation region 16 in other mesa portions 60 of the transistor portion 70.

The contact region 15 is provided to be exposed to the upper surface 21 of the semiconductor substrate 10. The contact region 15 may be in contact with the trench portions on both sides of the mesa portion 60. The contact region 15 has a higher doping concentration than the base region 14. The base region 14 may be provided in contact with the contact region 15.

In the mesa portion 60 of the diode portion 80, the P− type base region 14 and the N+ type accumulation region 16 are sequentially provided from the upper surface 21 of the semiconductor substrate 10. The base region 14 is provided to be exposed to the upper surface 21 of the semiconductor substrate 10. The accumulation region 16 is the same as the accumulation region 16 in the other mesa portions 60. Further, the accumulation region 16 may be not provided in at least a part of the mesa portion 60 of the diode portion 80 and the boundary portion 90.

In the mesa portion 60 in contact with the gate trench portion 40, the intermediate region 102 is provided. As an example, the intermediate region 102 is a P+ type. The intermediate region 102 may be provided even in the mesa portion 60 without contact with the gate trench portion 40. The intermediate region 102 is a region of the second conductivity type provided between the upper end of the base region 14 and the lower end of the accumulation region 16. However, the base region 14 remains on the upper side of the intermediate region 102, and the accumulation region 16 remains on the lower side of the intermediate region 102. Although the intermediate region 102 in the example of FIG. 2 is provided at the depth position overlapped with the boundary between the base region 14 and the accumulation region 16, the intermediate region 102 may be provided at the depth position which is not overlapped with the boundary.

In both of the transistor portion 70 and the diode portion 80, an N+ type buffer region 20 is provided below the drift region 18. The doping concentration of the buffer region 20 is higher than the doping concentration of the drift region 18. The buffer region 20 may function as a field stop layer which prevents a depletion layer expanding from the lower end of the base region 14 reaches a P+ type collector region 22 and the N+ type cathode region 82. The buffer region 20 may have a plurality of peaks in the doping concentration distribution in the depth direction, or may have a single peak.

In the transistor portion 70, the P+ type collector region 22 is provided below the buffer region 20. In the diode portion 80, the N+ type cathode region 82 is provided below the buffer region 20. The collector region 22 and the cathode region 82 are exposed to the lower surface 23 of the semiconductor substrate 10.

One or more gate trench portions 40 and one or more dummy trench portions 30 are provided on a side near the upper surface 21 of the semiconductor substrate 10. Each trench portion passes through the base region 14 from the upper surface 21 of the semiconductor substrate 10, and reaches the drift region 18. In a region where at least any of the emitter region 12, the contact region 15, and the accumulation region 16 is provided, each trench portion passes even through the doping region and reaches the drift region 18. The configuration that the trench portion passes through the doping region is not limited to a manufacturing procedure that the doping region is formed and then the trench portion is formed. The configuration that the trench portion passes through the doping region includes the doping region formed between the trench portions after the trench portions are formed.

The gate trench portion 40 includes a gate trench provided in the upper surface 21 of the semiconductor substrate 10, a gate insulating film 42, and a gate conductive portion 44. The gate insulating film 42 is provided to cover the inner wall of the gate trench. The gate insulating film 42 may be formed by oxidizing or nitriding the semiconductor on the inner wall of the gate trench. The gate conductive portion 44 is provided inside from the gate insulating film 42 in the gate trench. That is, the gate insulating film 42 insulates the gate conductive portion 44 and the semiconductor substrate 10. The gate conductive portion 44 is formed of a conductive material such as polysilicon.

The gate conductive portion 44 may be provided longer than the base region 14 in the depth direction. The gate trench portion 40 in the cross section is covered by the interlayer dielectric film 38 in the upper surface 21 of the semiconductor substrate 10. If a predetermined voltage is applied to the gate conductive portion 44, a channel is formed by an electron inversion layer on the surface of the base region 14 at the boundary in contact with the gate trench.

The dummy trench portion 30 may have the same structure as the gate trench portion 40 in the cross section. The dummy trench portion 30 includes a dummy trench provided in the upper surface 21 of the semiconductor substrate 10, a dummy insulating film 32, and a dummy conductive portion 34. The dummy insulating film 32 is provided to cover the inner wall of the dummy trench. The dummy conductive portion 34 is provided in the dummy trench, and is provided inside from the dummy insulating film 32. The dummy insulating film 32 insulates the dummy conductive portion 34 and the semiconductor substrate 10. The dummy conductive portion 34 may be formed of the same material as the gate conductive portion 44. For example, the dummy conductive portion 34 is formed of a conductive material such as polysilicon. The dummy conductive portion 34 may have the same length as the gate conductive portion 44 in the depth direction.

The gate trench portion 40 and the dummy trench portion 30 of this example are covered by the interlayer dielectric film 38 in the upper surface 21 of the semiconductor substrate 10. Further, the bottoms of the dummy trench portion 30 and the gate trench portion 40 may have a curved surface (a curved shape in cross section) which is convex downward.

Figure 3:
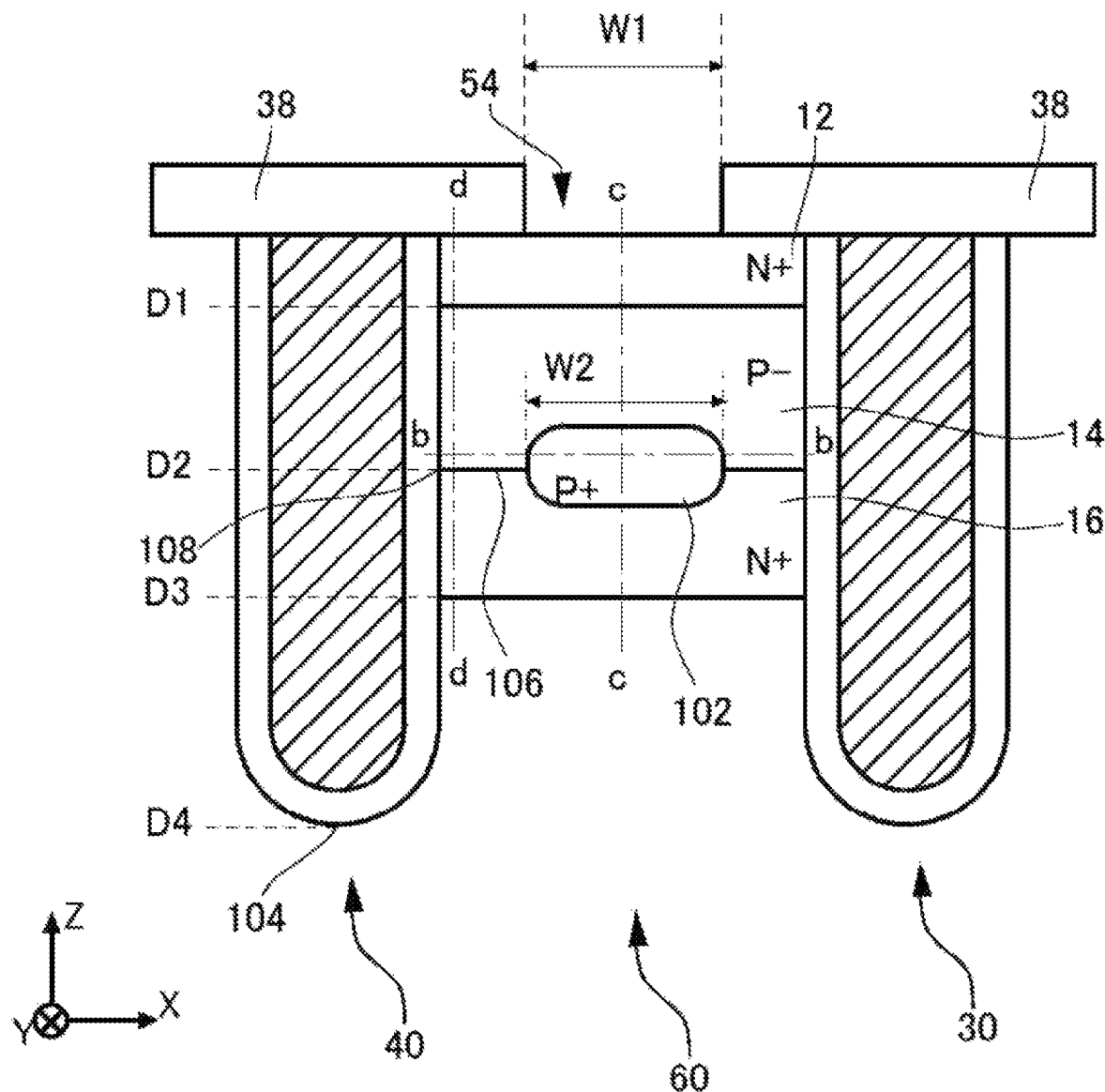
FIG. 3 is an enlarged view of a mesa portion 60 in contact with a gate trench portion 40.

FIG. 3 is an enlarged view of the mesa portion 60 in contact with the gate trench portion 40. In FIG. 3, a depth position of the lower end of the emitter region 12 is D1, a depth position of the lower end of the base region 14 is D2, a depth position of the lower end of the accumulation region 16 is D3, and a depth position of a lower end 104 of the gate trench portion 40 is D4. The depth positions D1, D2, and D3 may be depth positions in the regions in contact with the gate trench portion 40. The depth position D2 is a depth position of an end portion 108 in the X axis direction, in a PN junction 106 in the boundary between the base region 14 and the accumulation region 16. The end portion 108 indicates a portion in contact with the gate trench portion 40 in the PN junction 106.

The doping concentration of the dopant (the acceptor in this example) of the second conductivity type of the region where the intermediate region 102 is provided is higher than the doping concentration of the dopant of the second conductivity type of the corresponding region in the mesa portion 60 where the intermediate region 102 is not provided. The corresponding region in the mesa portion 60 indicates a region at the same coordinates in a coordinate system for each mesa portion 60 in which the upper surface of the mesa portion 60 is an origin position of the Z axis direction and the center of the mesa portion 60 in the X axis direction is the origin position of the X axis direction. The mesa portion 60 where the intermediate region 102 is not provided is, for example, the mesa portion 60 in the diode portion 80 illustrated in FIGS. 1 and 2.

In addition, at the depth position where the intermediate region 102 is provided, the doping concentration of the acceptor of the center in the arranging direction (X axis direction) of the mesa portion 60 is higher than the doping concentration of the acceptor at a position in contact with the gate trench portion 40. The intermediate region 102 in the example of FIG. 3 is provided apart from the gate trench portion 40. The intermediate region 102 may be provided also apart from the dummy trench portion 30. That is, at least one of the base region 14 and the accumulation region 16 is disposed between the intermediate region 102 and each trench portion.

According to this example, the doping concentration of the acceptor of the region where the intermediate region 102 is provided can be increased. With this configuration, the N type dopant contained in the accumulation region 16 can be suppressed from being diffused into the base region 14. Therefore, the short channel effect is suppressed, and a variation of saturation current can be suppressed. In addition, the influence of the acceptor in the intermediate region 102 on the characteristics of the channel can be suppressed by lowering the doping concentration of the acceptor at the position in contact with the gate trench portion 40.

In addition, by arranging the dummy trench portion 30 and the intermediate region 102 apart, the accumulation region 16 can be disposed in contact with the dummy trench portion 30. In general, holes are likely to be gathered near the dummy trench portion 30 at the time of turning on the transistor portion 70. When the holes are gathered and the region near the dummy trench portion 30 is inverted to a P-type region, the holes pass through the region and escape to the base region 14. In this case, the IE effect is reduced. By remaining the accumulation region 16 in contact with the dummy trench portion 30, the region near the dummy trench portion 30 can be suppressed to be inverted to a P type region.

A width W2 of the intermediate region 102 in the arranging direction (X axis direction) may be the same as a width W1 of the contact hole 54 in the arranging direction, or may be larger than the width W. The width W2 of the intermediate region 102 may be smaller than the width of the mesa portion 60 in the arranging direction. By implanting the dopant in the intermediate region 102 through the contact hole 54, the intermediate region 102 can be disposed at the center of the mesa portion 60 in the X axis direction. The intermediate region 102 can be easily formed apart from the gate trench portion 40. Further, the width W2 of the intermediate region 102 may be smaller than the width W1 of the contact hole 54.

Figure 4:
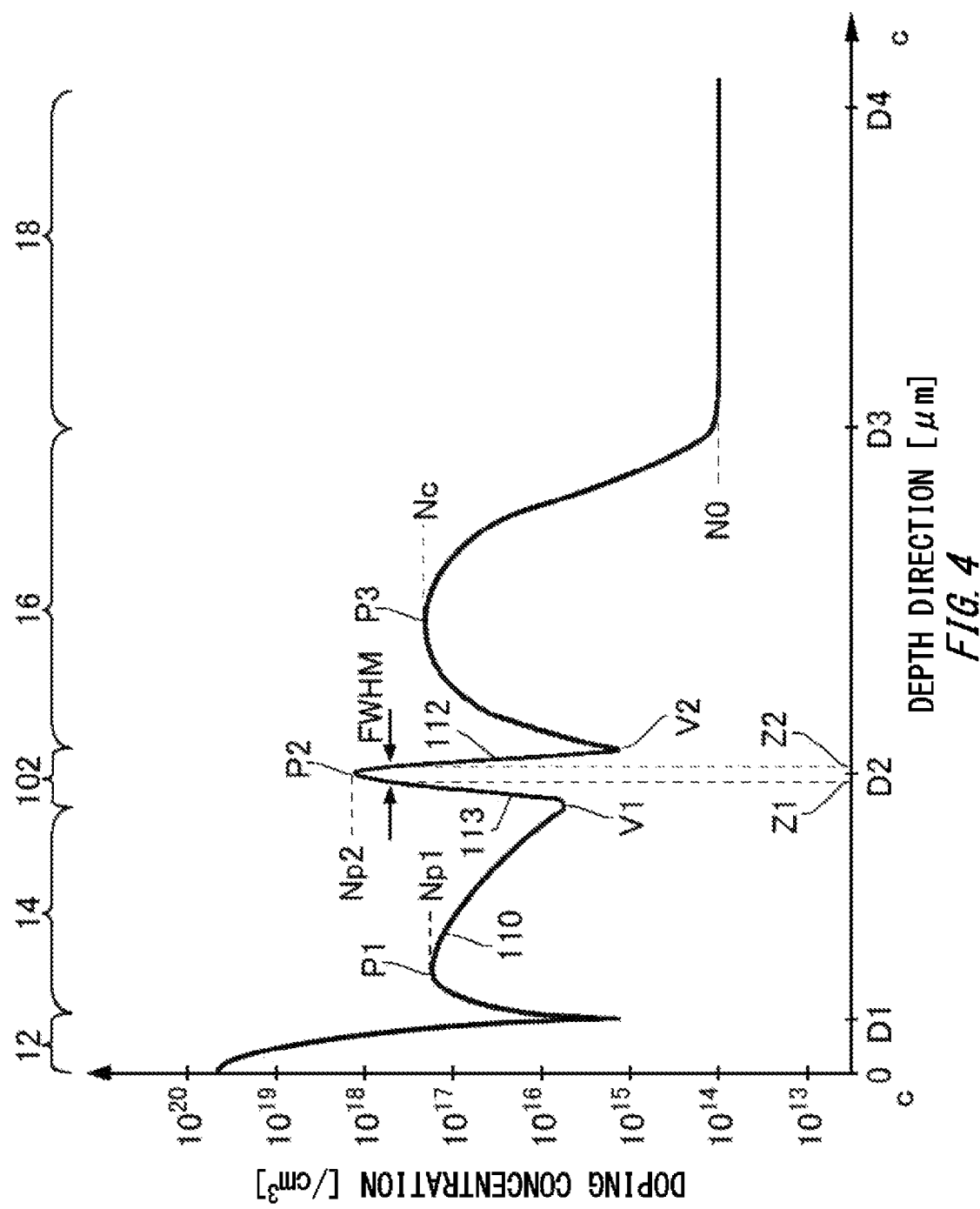
FIG. 4 is a diagram illustrating an example of a doping concentration distribution in line c-c of FIG. 3.

FIG. 4 is a diagram illustrating an example of the doping concentration distribution in a line c-c of FIG. 3. The line c-c is a line which is in parallel to the depth direction (Z axis direction) and passes through the center of the mesa portion 60 in the arranging direction (X axis direction). The doping concentration distribution in the depth direction illustrated in FIG. 4 is a net doping concentration which can be measured by the SR method, but a chemical concentration which can be measured by the SIMS method may be used. In this specification, the horizontal axis of the drawing illustrating the doping concentration is a linear axis, and the vertical axis is a logarithmic axis. In this example, the doping concentration in the drift region 18 is N0.

The base region 14 has a first peak P1 in the doping concentration distribution in the depth direction of the semiconductor substrate 10. The doping concentration at the first peak P1 is Np1. The intermediate region 102 has a peak or a kink portion in the doping concentration distribution in the depth direction. The peak or the kink portion of the intermediate region 102 may be disposed from the depth position of the first peak P1 up to the depth position D4 of the lower end 104 of the gate trench portion 40.

In the example of FIG. 4, the intermediate region 102 has a second peak P2. The doping concentration at the second peak P2 is Np2. Since the intermediate region 102 has the second peak P2 different from the first peak P1 of the base region 14, the N dopant from the accumulation region 16 is easily suppressed from being diffused into the base region 14.

Figure 5:
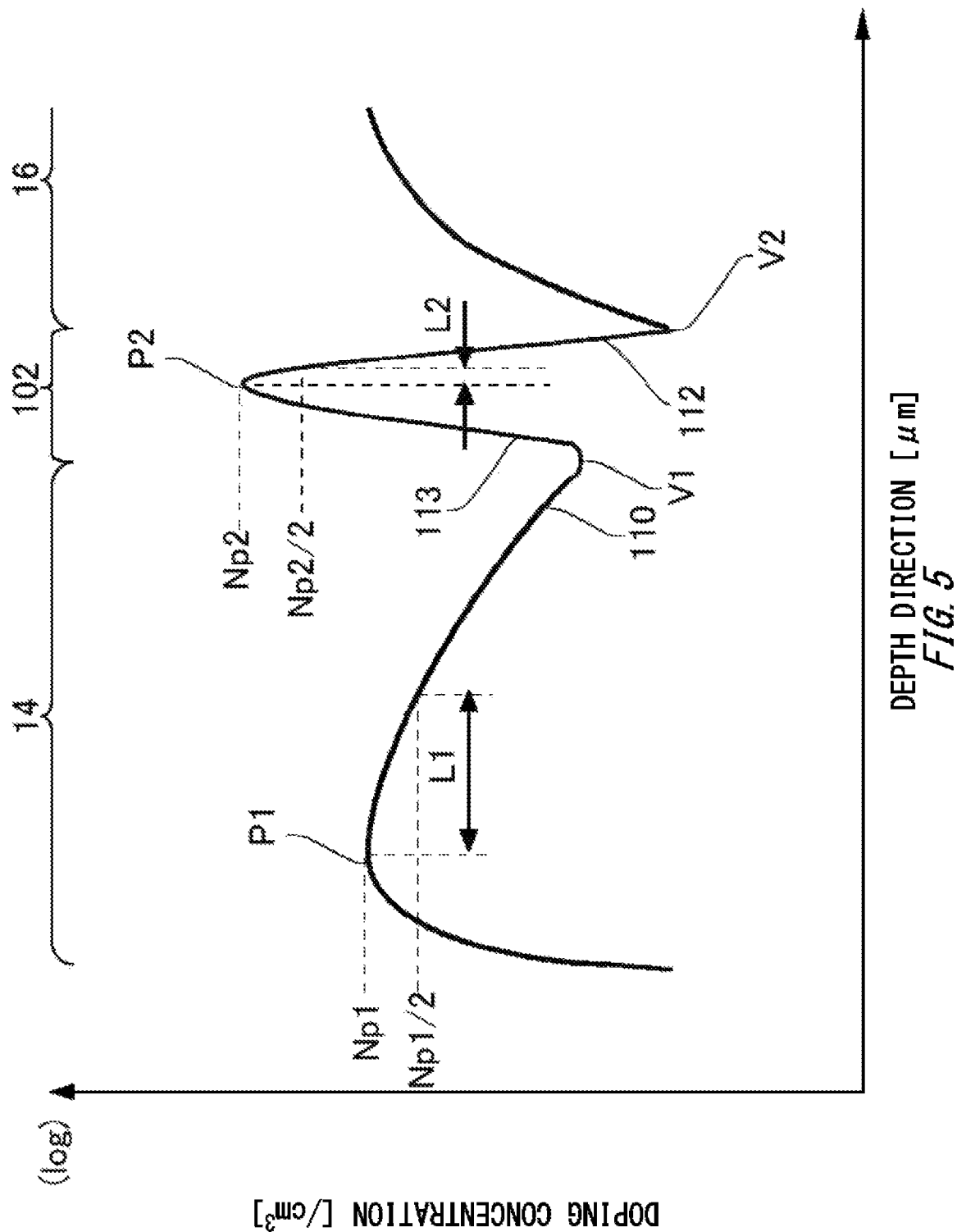
FIG. 5 is a diagram illustrating a portion near tails 110, 112, and 113 in the doping concentration distribution on a magnified scale.

The accumulation region 16 of this example has one or more peaks in the doping concentration distribution in the depth direction of the semiconductor substrate 10. In the example of FIG. 5, the accumulation region 16 has a third peak P3. The doping concentration of the third peak P3 is Nc. The second peak P2 of the intermediate region 102 is disposed on the upper side from the third peak P3 of the accumulation region 16. The upper side in this example indicates a side near the base region 14. With such an arrangement, the dopant of the third peak P3 of a relatively high concentration can be suppressed from being diffused toward the base region 14. The doping concentration Np2 may be higher than the doping concentration Nc. The doping concentration Nc may be higher than the doping concentration Np1. In another example, the doping concentration Nc may be lower than the doping concentration Np1.

In a case where the doping concentration distribution in the depth direction of the accumulation region 16 has a plurality of peaks, the second peak P2 may be disposed on the upper side from the peak on the lowermost side of the accumulation region 16. The second peak P2 is desirably disposed on the upper side from the peak on the uppermost side of the accumulation region 16. With this configuration, it is possible to suppress the dopant from being diffused to the base region 14 from the peak of the accumulation region 16 disposed on the lower side from the second peak P2.

The intermediate region 102 of this example is provided in a range including the depth position D2 which is the boundary between the base region 14 and the accumulation region 16. That is, the intermediate region 102 is provided in a range overlapped with the depth position D2. In this example, a first valley V1 of the doping concentration distribution is disposed in the boundary between the intermediate region 102 and the base region 14. In addition, a second valley V2 of the doping concentration distribution is disposed in the boundary between the intermediate region 102 and the accumulation region 16. The depth position D2 may be disposed between the depth position of the first valley V1 and the depth position of the second valley V2. With this configuration, it is possible to efficiently suppress that the dopant of the accumulation region 16 is diffused into the base region 14 so as to change the depth position D2 of the lower end of the base region 14. In the valley V2, an acceptor concentration and a donor concentration are matched. Therefore, the net doping concentration of the valley V2 is theoretically 0. The acceptor concentration or the donor concentration of the valley V2 may be higher than the doping concentration (the donor concentration in this example) N0 of the drift region 18.

The doping concentration distribution in the depth direction of the intermediate region 102 has a predetermined full width at half maximum FWHM with reference to the second peak P2. The full width at half maximum FWHM indicates a width in a range from a position Z1, where the doping concentration on the upper side of the second peak P2 becomes Np2/2, to a position Z2 where the doping concentration on the lower side of the second peak P2 becomes Np2/2. The depth position D2 may be disposed within the range of the full width at half maximum FWHM with reference to the second peak P2.

In addition, at least a part of the intermediate region 102 may be provided on the upper side from the depth position D2. That is, the depth position Z1 may be disposed on the upper side from the depth position D2. At least a part of the intermediate region 102 may be provided on the lower side from the depth position D2. That is, the depth position Z2 may be disposed on the lower side from the depth position D2.

With such a configuration, the concentration of the acceptor at the depth position D2 which is the boundary between the base region 14 and the accumulation region 16 can be increased. It is possible to suppress a positional deviation of the lower end of the base region 14 due to the dopant diffusion from the accumulation region 16. In addition, a distance between the first peak P1 and the second peak P2 can be easily secured, and the influence of the second peak P2 on the doping concentration Np1 of the first peak P1 can be reduced. In addition, a portion of the intermediate region 102 that enters the accumulation region 16 can be reduced, and the thickness of the accumulation region 16 in the depth direction can be easily secured. Therefore, the IE effect of the accumulation region 16 is easily maintained.

The depth position of the second peak P2 may be the same as the depth position D2. In another example, the depth position of the second peak P2 may be disposed within 0.2 µm from the depth position D2, or may be disposed within 0.1 µm.

The doping concentration Np2 of the second peak P2 may be higher than the doping concentration Np1 of the first peak P1 Therefore, the diffusion of dopant from the accumulation region 16 to the base region 14 can be suppressed with efficiency. The doping concentration Np2 may be twice or more, five times or more, or ten times or more than the doping concentration Np1.

The doping concentration Np2 of the second peak P2 may be higher than the doping concentration Nc of the third peak P3. Therefore, the diffusion of dopant from the accumulation region 16 to the base region 14 can be suppressed with efficiency. The doping concentration Np2 may be twice or more, five times or more, or ten times or more than the doping concentration Nc.

The doping concentration distribution in the depth direction on the lower side from the second peak P2 of the intermediate region 102 may be more steeply changed than the doping concentration distribution in the depth direction on the lower side from the first peak P1 of the base region 14. That is, in the doping concentration distribution in the depth direction, a tail 112 on the lower side of the second peak P2 is more steeply changed than a tail 110 on the lower side of the first peak P1. Therefore, the length that the intermediate region 102 enters the accumulation region 16 can be small, and the thickness of the accumulation region 16 can be maintained.

Similarly, the doping concentration distribution in the depth direction on the upper side from the second peak P2 of the intermediate region 102 may be more steeply changed than the doping concentration distribution in the depth direction on the lower side from the first peak P1 of the base region 14. That is, in the doping concentration distribution in the depth direction, a tail 113 on the upper side of the second peak P2 is more steeply changed than the tail 110 on the lower side of the first peak P1. Therefore, the distance between the intermediate region 102 and the first peak P1 can be secured.

FIG. 5 is a diagram illustrating a portion near the tails 110, 112, and 113 in the doping concentration distribution on a magnified scale. In this example, a distance from the depth position of the first peak P1 to the depth position where the doping concentration is half of Np1 on the lower side of the first peak P1 is L1. In addition, a distance from the depth position of the second peak P2 to the depth position where the doping concentration is half of Np2 on the lower side of the second peak P2 is L2. The configuration that the tail 112 is steeper than the skirt 110 may indicate that the distance L2 is smaller than the distance L1. The distance L2 may be equal to or less than half of the distance L1, or may be ⅕ or less. Further, although the tail 112 has been described in FIG. 5, the same applies to the skirt 113.

As an example, the intermediate region 102 having a steep doping concentration distribution can be formed by reducing a thermal history of the dopant implanted to the intermediate region 102. For example, in a step after the dopant implantation to the base region 14 and the annealing processing, the intermediate region 102 having a steep doping concentration distribution can be formed by implanting the dopant to the intermediate region 102.

Figure 6:
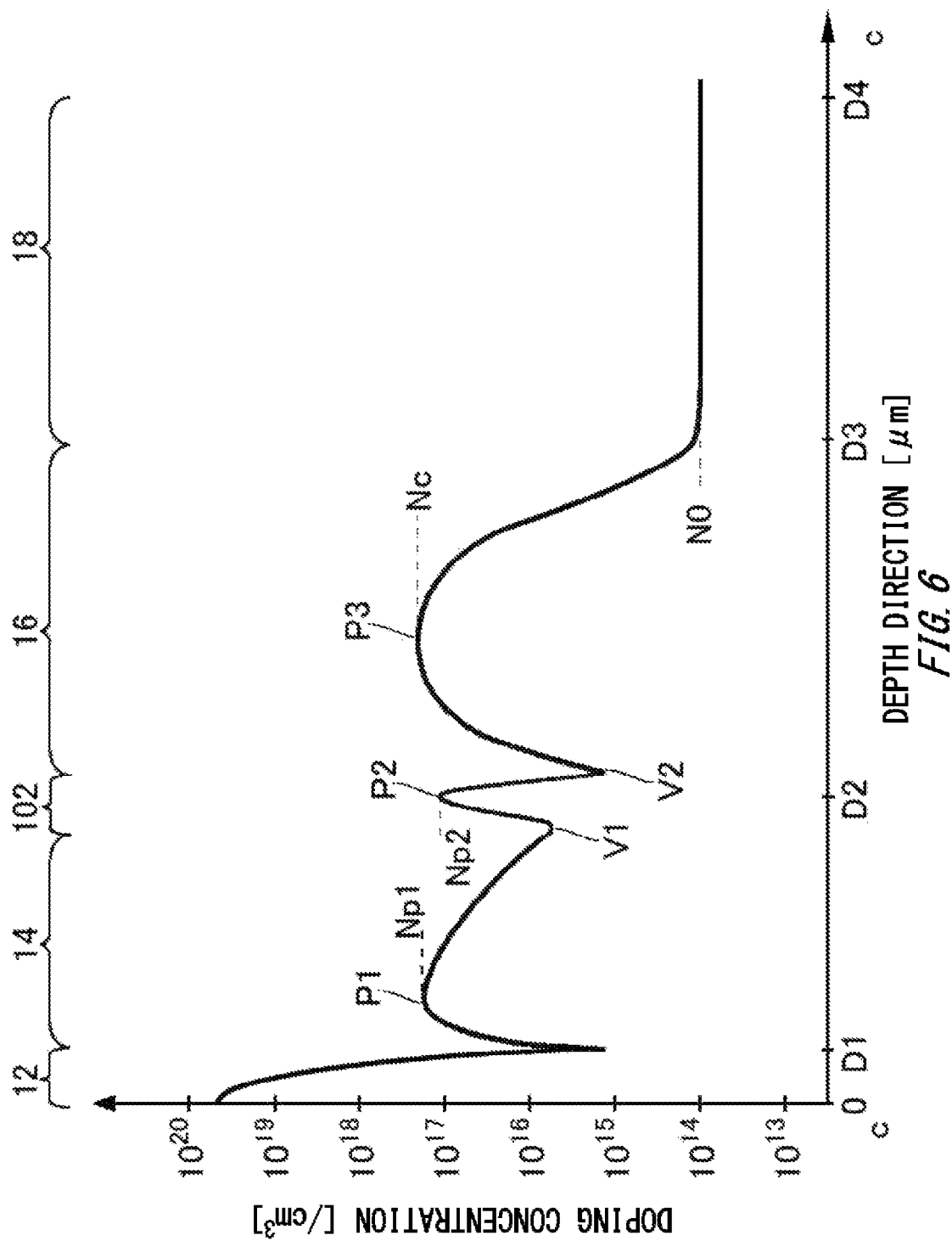
FIG. 6 is a diagram illustrating another example of the doping concentration distribution in line c-c of FIG. 3.

FIG. 6 is a diagram illustrating another example of the doping concentration distribution in a line c-c of FIG. 3. In the doping concentration distribution of this example, the doping concentration Np2 of the second peak P2 is different from the example illustrated in FIGS. 4 and 5. The other configurations are the same as those of the example described in FIGS. 4 and 5.

The doping concentration Np2 of this example is smaller than the doping concentration Np1 of the first peak P1. Therefore, the intermediate region 102 easily reduces the influence on a channel. For example, the dopant of the intermediate region 102 can be suppressed from being diffused up to a position in contact with the gate trench portion 40 or a position of the first peak P1. The doping concentration Np2 may be equal to or less than half of the doping concentration Np1, may be equal to or less than ⅕, or may be equal to or less than 1/10. However, the doping concentration Np2 is higher than the doping concentration of the region corresponding to the intermediate region 102 in the mesa portion 60 where the intermediate region 102 is not provided.

The doping concentration Np2 may be smaller than the doping concentration Nc of the third peak P3. The doping concentration Np2 may be equal to or less than half of the doping concentration Nc, may be equal to or less than ⅕, or may be equal to or less than 1/10. In addition, in another example, the doping concentration Np2 may be equal to at least one of the doping concentrations Np1 and Nc. In addition, in another example, the doping concentration Np2 may be lower than the doping concentration Np1, and the doping concentration Nc may be lower than the doping concentration Np2.

Figure 7:
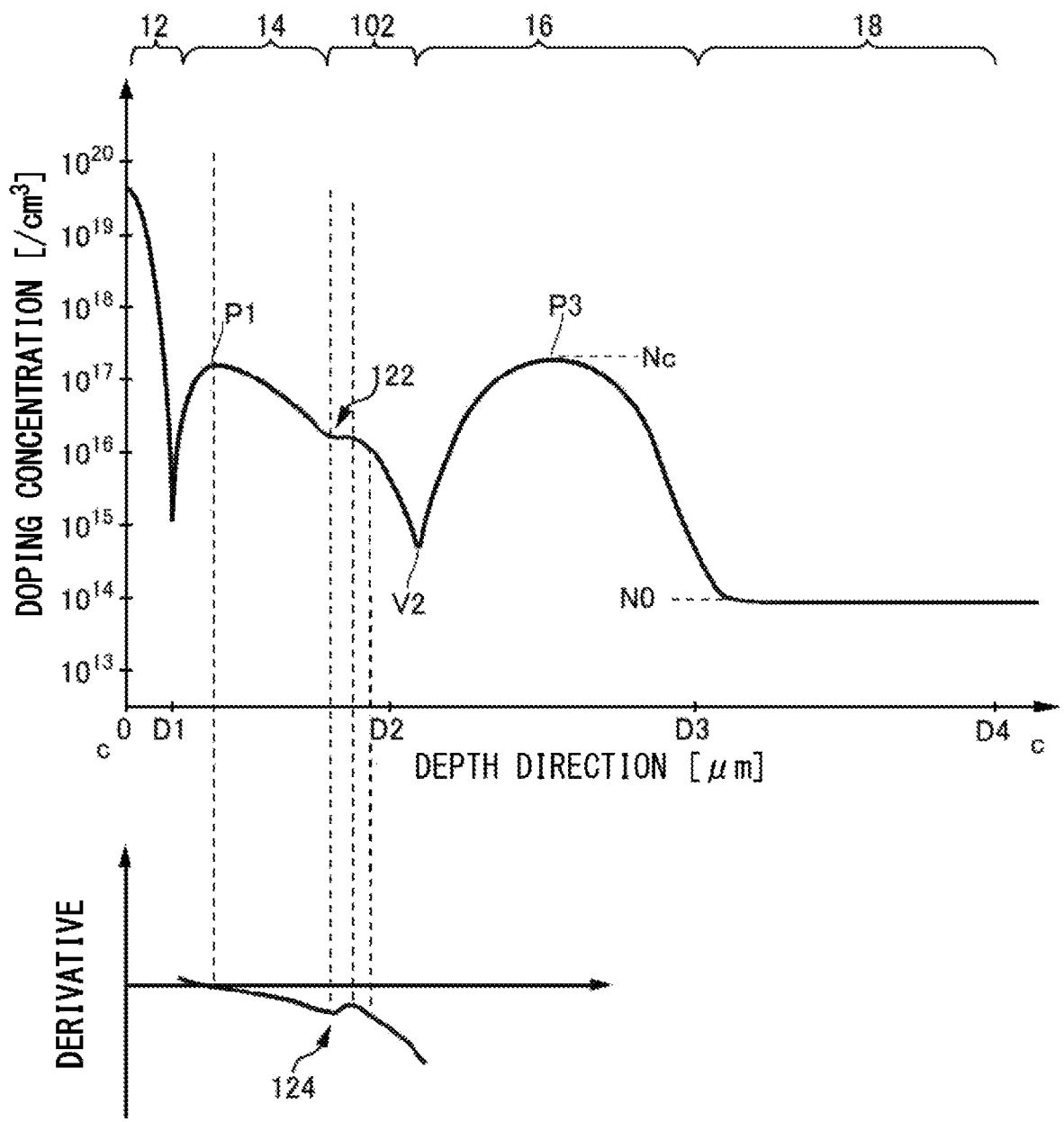
FIG. 7 is a diagram illustrating another example of the doping concentration distribution in line c-c FIG. 3.

FIG. 7 is a diagram illustrating another example of the doping concentration distribution in a line c-c of FIG. 3. The doping concentration distribution of this example is the doping concentration distribution in the intermediate region 102, but different from the example illustrated in FIGS. 4 and 5. The other configurations are the same as those of the example described in FIGS. 4 and 5.

The doping concentration distribution in the depth direction of the intermediate region 102 of this example has a kink portion 122 where a derivative shows an extreme value 124. The derivative of the doping concentration distribution indicates a value obtained by differentiating the doping concentration distribution at a position in the depth direction. In this example, the derivative at the depth position of the first peak P1 is changed from positive to negative, and the derivative of the depth position of the kink portion 122 shows a local minimum value.

With the kink portion 122, the doping concentration on the lower side from the kink portion 122 can be made high compared to a case where the kink portion 122 is not provided. The end portion on the upper side of the intermediate region 102 of this example is the position showing that the derivative of the doping concentration distribution is the extreme value 124 (local minimum value). The end portion on the lower side of the intermediate region 102 is the position of the valley V2 of the doping concentration distribution. The kink portion 122 can be formed by implanting the dopant having such a concentration that the second peak P2 is not clearly observed. The position and the length in the depth direction of the intermediate region 102 of this example may employ the position and the length of the intermediate region 102 described in FIGS. 4 and 5. In addition, the position of the extreme value 124 of the kink portion 122 may be provided at the depth position of the second peak P2 described in FIGS. 4 and 5.

Figure 8:
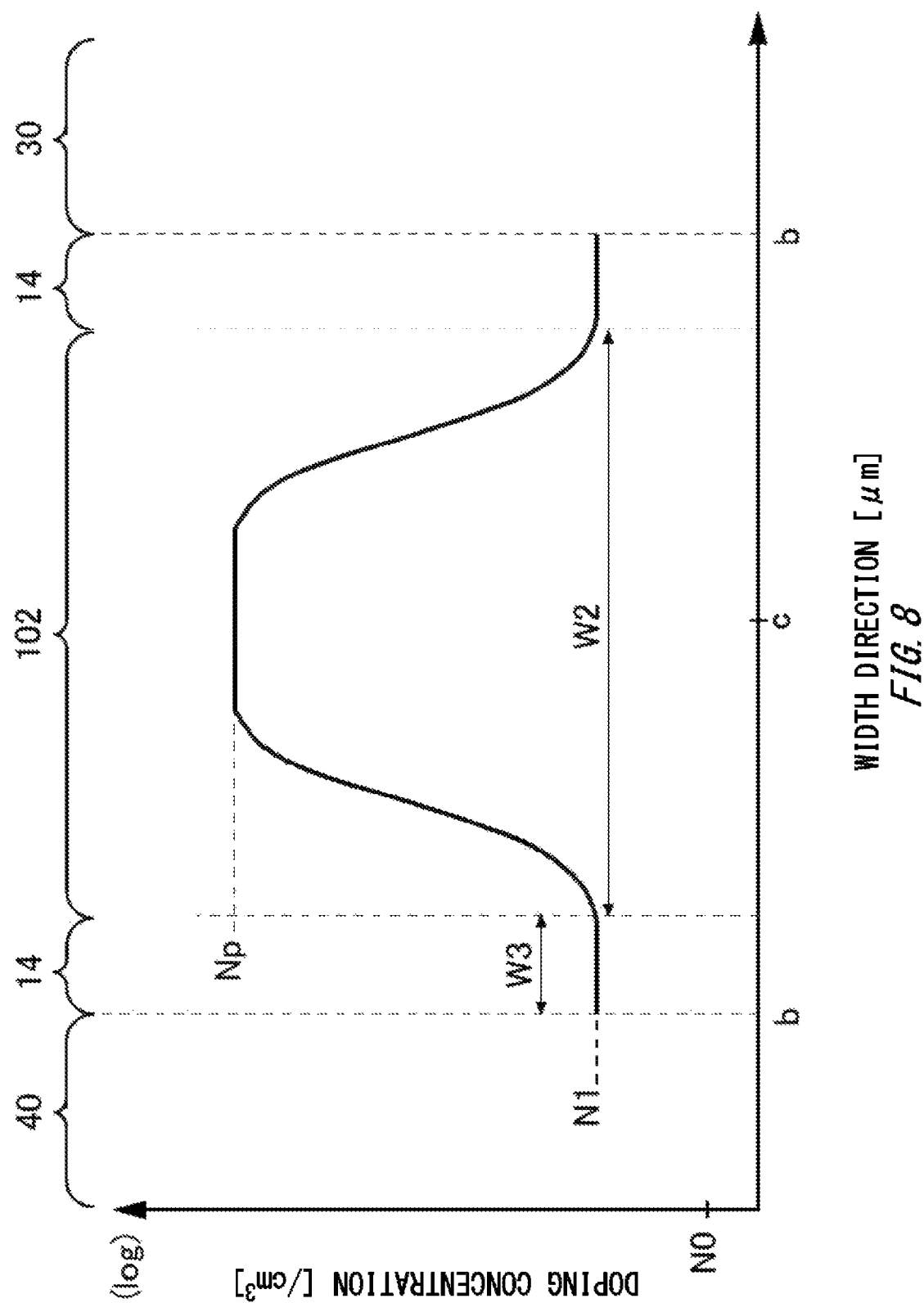
FIG. 8 is a diagram illustrating an example of the doping conentration distribution of an acceptor in line b-b of FIG. 3.

FIG. 8 is a diagram illustrating an example of the doping concentration distribution of the acceptor in a line b-b of FIG. 3. The line b-b is a line which is in parallel to the X axis extending from one trench portion interposing the mesa portion 60 to the other trench portion, and passes through the intermediate region 102. The line b-b is disposed on the upper side from the PN junction 106. In FIG. 8, the horizontal axis represents a position in a width direction (X axis direction), and the vertical axis represents the doping concentration of the acceptor. The doping concentration in FIG. 8 is, for example, a chemical concentration which can be measured by the SIMS method, may be a carrier concentration of a p type layer or an n type layer which can be measured by the SR method, or may be a net doping concentration which is calculated from the carrier concentration. In the case of the net doping concentration, the line b-b is desirably apart from the PN junction 106 to an extent that the influence of the doping concentration of the donor can be reduced sufficiently. For example, the distance between the line b-b and the PN junction 106 is equal to or more than 0.1 µm.

The doping concentration distribution of this example becomes a peak concentration Np at a center position c of the mesa portion 60 in the X axis direction. The doping concentration distribution may be a constant peak concentration Np in a predetermined range in the X axis direction. The constant peak concentration may include an error within 10%. In a case where the terms of same and constant are used in this specification, an error within 10% may be allowed. The width in the X axis direction of the range indicating the constant peak concentration Np may be the same as the width W1 of the contact hole 54 illustrated in FIG. 3. In another example, the doping concentration distribution may indicate the peak concentration Np in a range shorter than the width W1 of the contact hole 54.

In the line b-b, the doping concentration N1 of the acceptor at a position in contact with the gate trench portion 40 is lower than the peak concentration Np. The base region 14 may be provided between the intermediate region 102 and the gate trench portion 40. In this case, the doping concentration N1 is the same as the doping concentration of the base region 14 at the same depth position as the line b-b in another mesa portion 60 where the intermediate region 102 is not provided.

The distance between the intermediate region 102 and the gate trench portion 40 is W3. The distance W3 may be smaller than the width W2 of the intermediate region 102. With this configuration, the intermediate region 102 can be formed up to the vicinity of the gate trench portion 40. Therefore, the N type dopant from the accumulation region 16 is easily suppressed from being diffused to the base region 14. The distance W3 may be 0.1 µm or more, or may be 0.2 µm or more. With this configuration, the influence of the intermediate region 102 on a channel can be suppressed.

Figure 9:
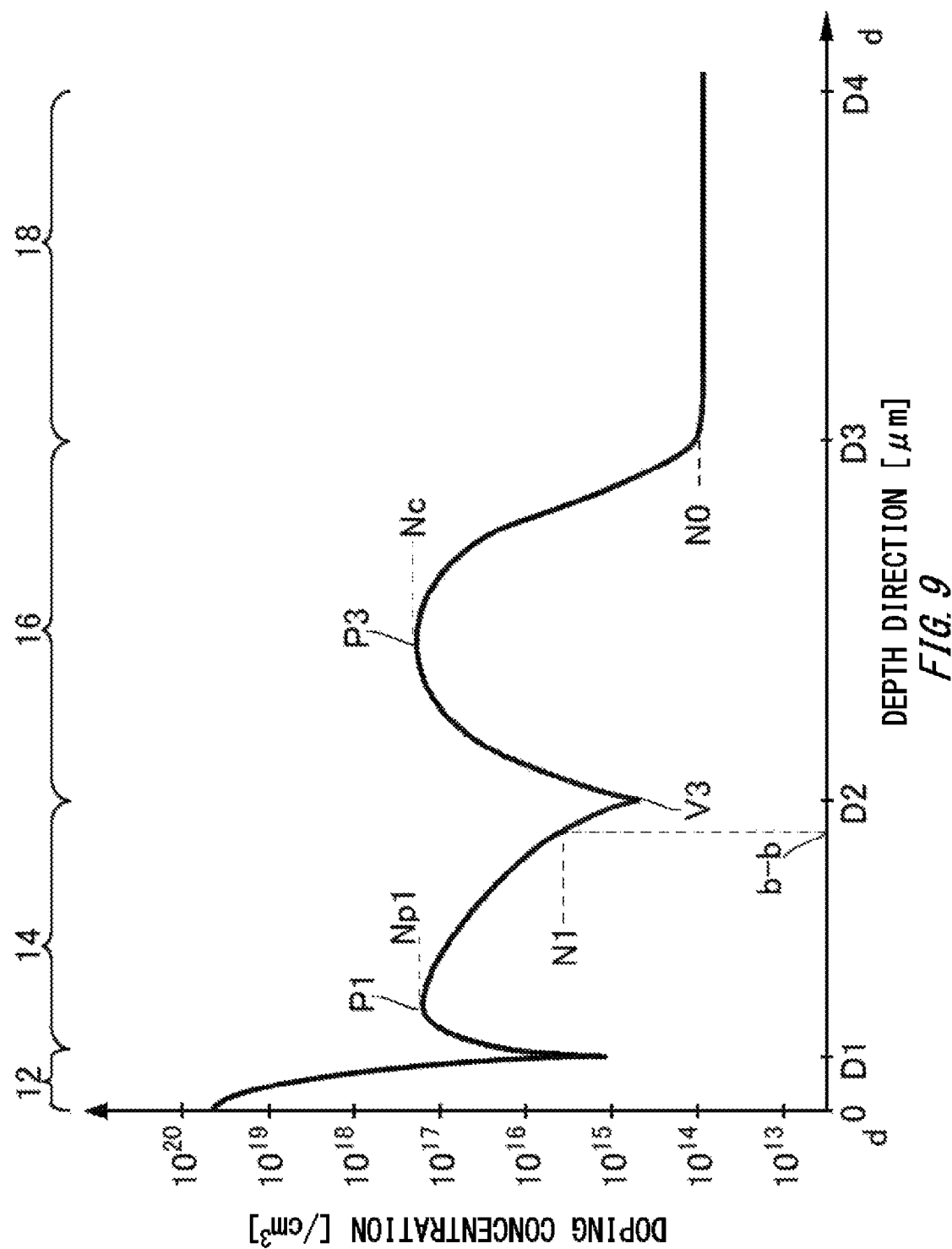
FIG. 9 is a diagram illustrating an example of the doping concentration distribution in line d-d of FIG. 3.

FIG. 9 is a diagram illustrating an example of the doping concentration distribution in a line d-d of FIG. 3. The line d-d is a line which is in parallel with the depth direction (Z axis direction) and passes through the mesa portion 60 near the gate trench portion 40. The line d-d may pass through the boundary between the gate trench portion 40 and the mesa portion 60. In this example, the intermediate region 102 is disposed apart from the gate trench portion 40. Therefore, the intermediate region 102 is not provided in the doping concentration distribution illustrated in FIG. 9. The doping concentration distribution of this example includes a third valley V3 at the depth position D2 of the boundary between the base region 14 and the accumulation region 16.

A gate threshold depends on the peak concentration Np1 of the base region 14 in contact with the gate trench portion 40. It is preferable that the peak concentration Np1 is as little affected by the dopant (the acceptor in this example) in the intermediate region 102 as possible. As an example, the distance W3 may be set as described above. In the valley V3, the acceptor concentration and the donor concentration are matched. Therefore, the net doping concentration of the valley V3 is theoretically 0. The acceptor concentration or the donor concentration of the valley V3 may be higher than the doping concentration (the donor concentration in this example) N0 of the drift region 18. The acceptor concentration or the donor concentration of the valley V3 may be lower than the acceptor concentration or the donor concentration of the valley V2.

Figure 10:
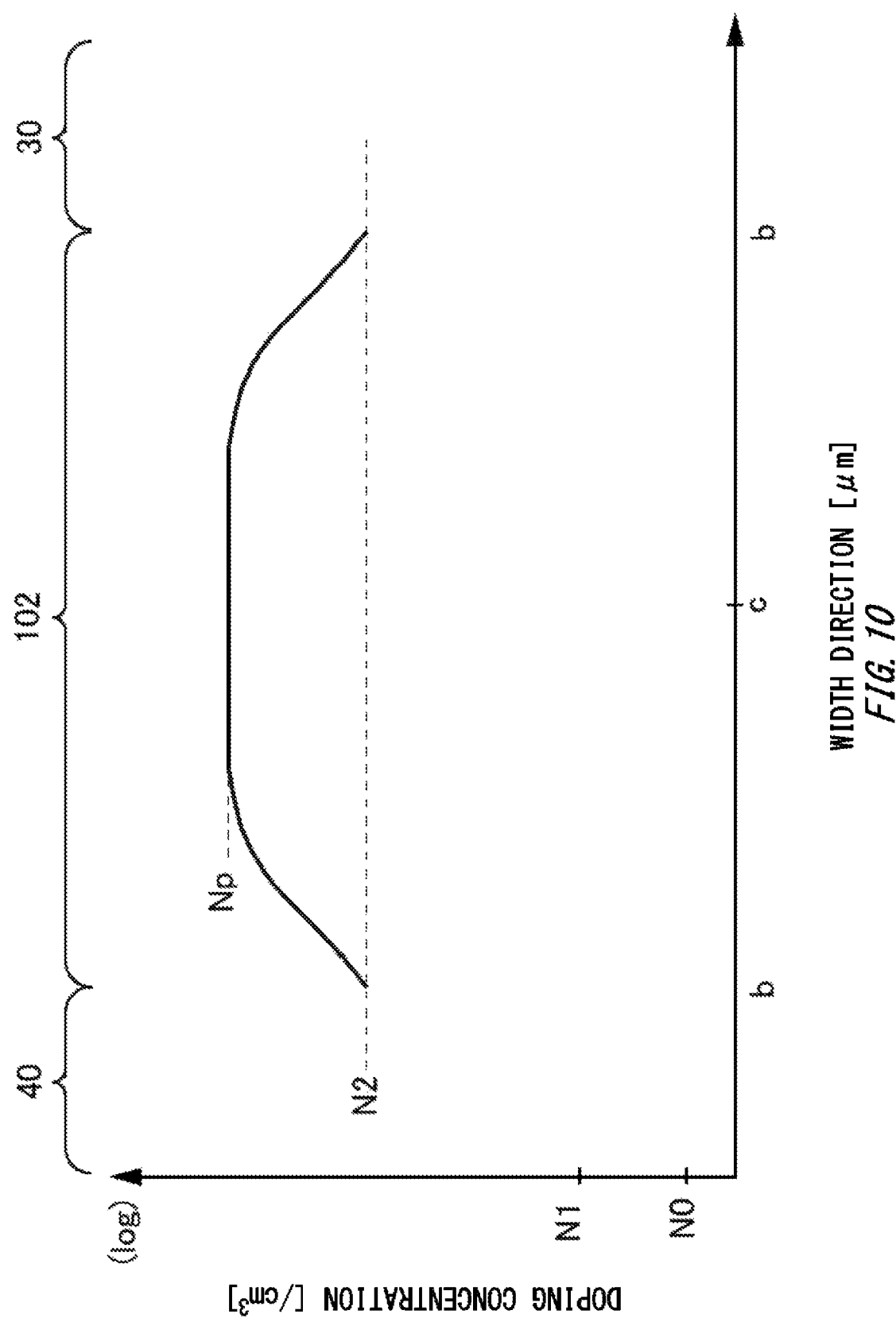
FIG. 10 is a diagram illustrating another example of the doping concentration distribution of the acceptor in line b-b of FIG. 3.

FIG. 10 is a diagram illustrating another example of the doping concentration distribution of the acceptor in the line b-b of FIG. 3. The intermediate region 102 of this example is provided in contact with the gate trench portion 40. The other structures are the same as those described in FIGS. 2 to 7. The intermediate region 102 may be in contact with the trench portions on both sides of the mesa portion 60.

The doping concentration distribution of this example becomes a peak concentration Np at a center position c of the mesa portion 60 in the X axis direction. The doping concentration distribution may be a constant peak concentration Np in a predetermined range in the X axis direction. The peak concentration Np is lower than the doping concentration Np1. With this configuration, the gate threshold can be determined by Np1 while providing the intermediate region 102. In the line b-b, the doping concentration N2 of the acceptor at a position in contact with the gate trench portion 40 is lower than the peak concentration Np. However, the concentration is higher than the doping concentration (for example, N1) at the same depth position as the line b-b in the mesa portion 60 where the intermediate region 102 is not provided. With such a configuration, the diffusion of dopant from the accumulation region 16 to the base region 14 can be suppressed. In addition, the influence of the intermediate region 102 on a channel can be suppressed by making the doping concentration N2 lower than the peak concentration Np. The doping concentration N2 may be equal to or less than half of the peak concentration Np, may be equal to or less than ⅕, or may be equal to or less than ¹⁄₁₀.

Figure 11:
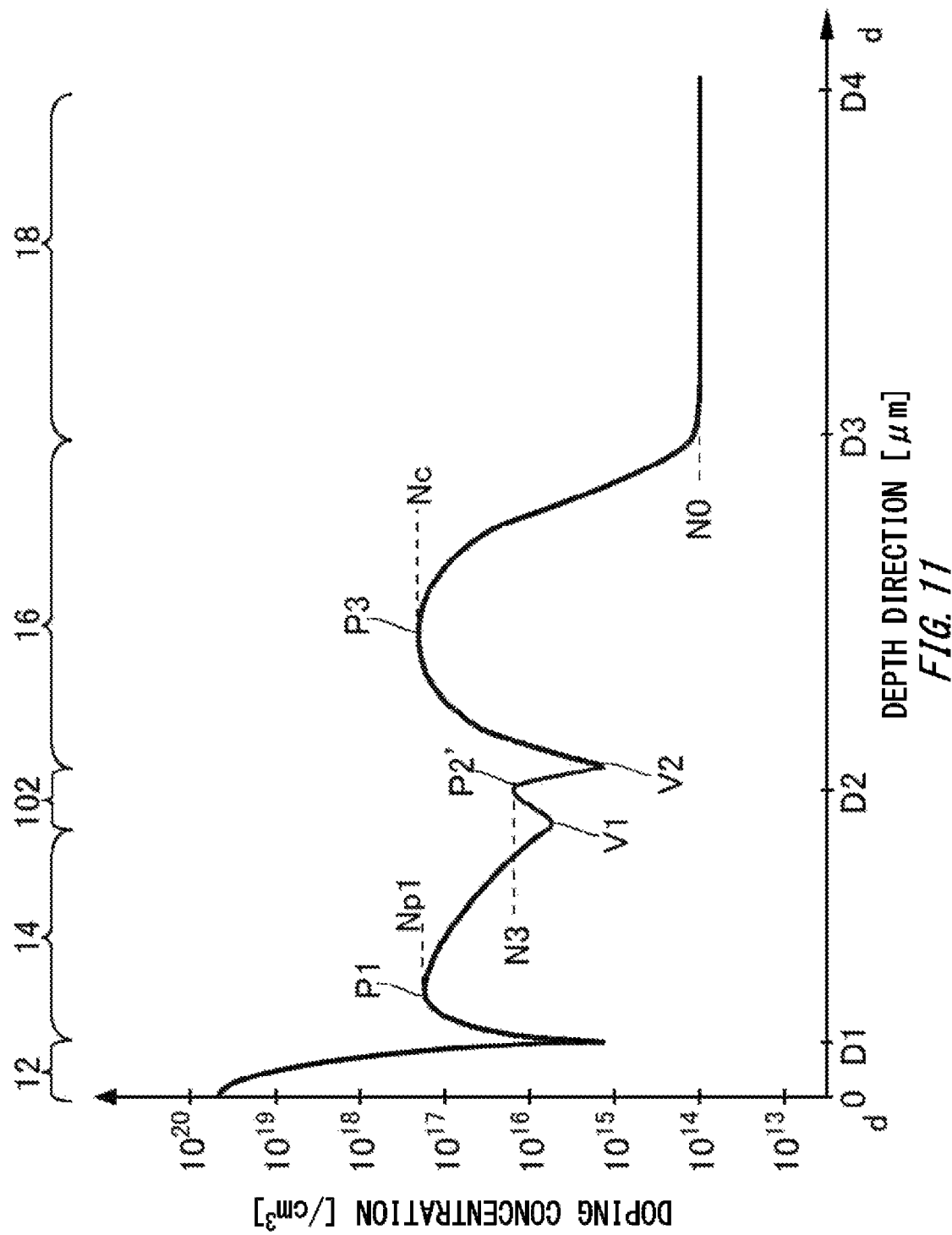
FIG. 11 is a diagram illustrating another example of the doping concentration distribution in line d-d of FIG. 3.

FIG. 11 is a diagram illustrating another example of the doping concentration distribution in the line d-d of FIG. 3. In the example of FIG. 11, as described in FIG. 10, the intermediate region 102 is disposed in contact with the gate trench portion 40.

The doping concentration distribution in the depth direction at a position in contact with the gate trench portion 40 has a second peak P2' in the intermediate region 102. The depth position of the second peak P2' is the same as the depth position of the second peak P2 at the center in the width direction of the mesa portion 60. The doping concentration of the second peak P2' is N3. In this example, the doping concentration N3 of the second peak P2' is lower than the doping concentration Np1 of the first peak P1. With this configuration, the influence of the intermediate region 102 on a channel can be suppressed while suppressing the diffusion of dopant from the accumulation region 16 to the base region 14. The doping concentration N3 may be equal to or less than half of the doping concentration Np1, may be equal to or less than ⅕, or may be equal to or less than ¹⁄₁₀.

Further, the base region 14 may have an even doping concentration distribution in the width direction (X axis direction). For example, the doping concentration of the first peak P1 at the center in the width direction of the mesa portion 60 is equal to the doping concentration of the first peak P1 at a position in contact with the gate trench portion 40.

The doping concentration distribution of this example can be combined with any of the example illustrated in FIG. 4 and the example illustrated in FIG. 6. When combined with the example of FIG. 4, the doping concentration Np2 of the second peak P2 is higher than the doping concentration Np1 of the first peak P1 at the center in the width direction of the mesa portion 60, and the doping concentration N3 of the second peak P2' is smaller than the doping concentration Np1 of the first peak P1 at a position in contact with the gate trench portion 40. With this configuration, the influence of the intermediate region 102 on a channel can be suppressed while suppressing the diffusion of dopant from the accumulation region 16 to the base region 14 with efficiency. When combined with the example of FIG. 6, the doping concentration Np2 (N3) of the second peak P2 (P2') is smaller than the doping concentration Np1 of the first peak P1 in both the center of the mesa portion 60 and the position in contact with the gate trench portion 40.

Figure 12:
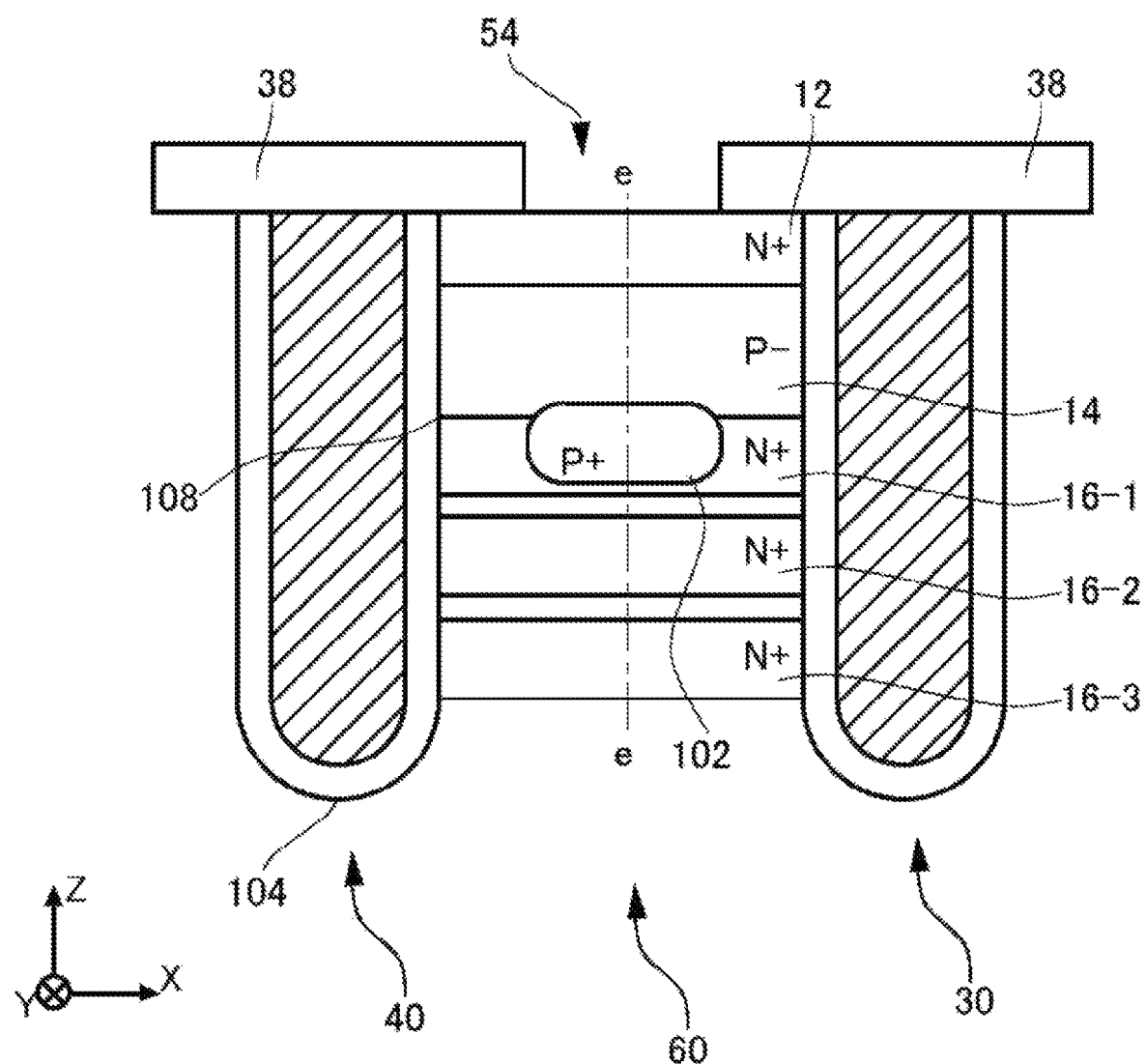
FIG. 12 is a diagram illustrating another configuration example of the mesa portion 60.

FIG. 12 is a diagram illustrating another configuration example of the mesa portion 60. The mesa portion 60 of this example has a plurality of accumulation regions 16 in the depth direction. The number of steps of the accumulation region 16 in the depth direction may be 2 steps, may be 3 steps, or may be other number of steps.

Figure 13:
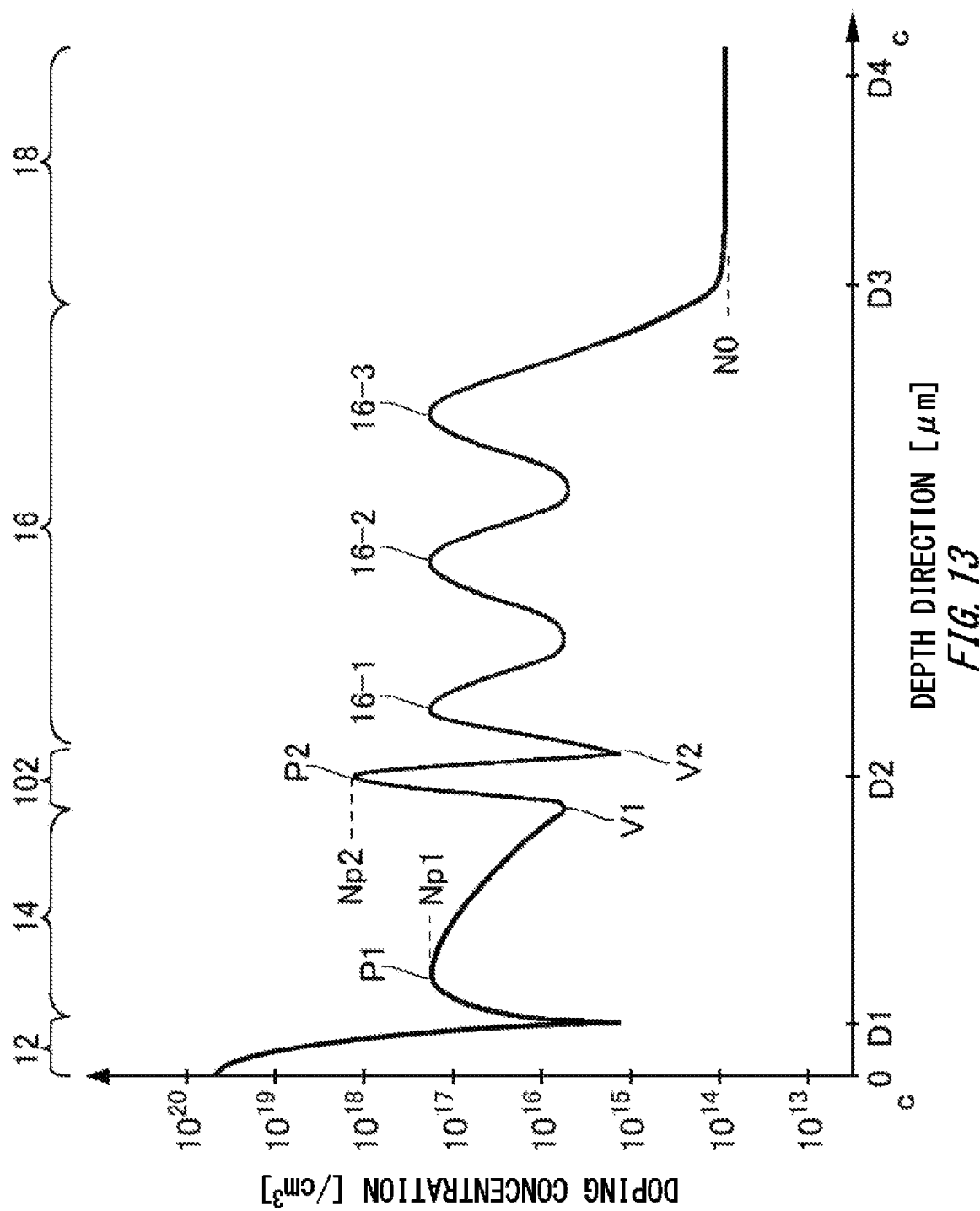
FIG. 13 is a diagram illustrating an example of the doping concentration distribution in line e-e of FIG. 12.

FIG. 13 is a diagram illustrating an example of the doping concentration distribution in a line e-e of FIG. 12. The line e-e is a line which is in parallel with the depth direction (Z axis direction) and passes through the center of the mesa portion 60 in the arranging direction (X axis direction).

Each of the accumulation regions 16 has a peak in the doping concentration distribution in the depth direction. The peaks of at least two accumulation regions 16 may be disposed on the lower side from the second peak P2 of the intermediate region 102. With this configuration, an electron current passed through the base region 14 easily flows near the center of the mesa portion 60 in the width direction. With the electron current flowing to the center of the mesa portion 60, it is possible to analyze a distribution of holes which are continuously distributed from the dummy trench portion 30 to the gate trench portion 40 on the lower side of the accumulation region 16. With this configuration, it is possible to reduce a displacement current flowing to the gate trench portion 40 at the time of turning on the semiconductor device 100. The reduction of the displacement current is disclosed in, for example, WO 2018/030440.

Figure 14:
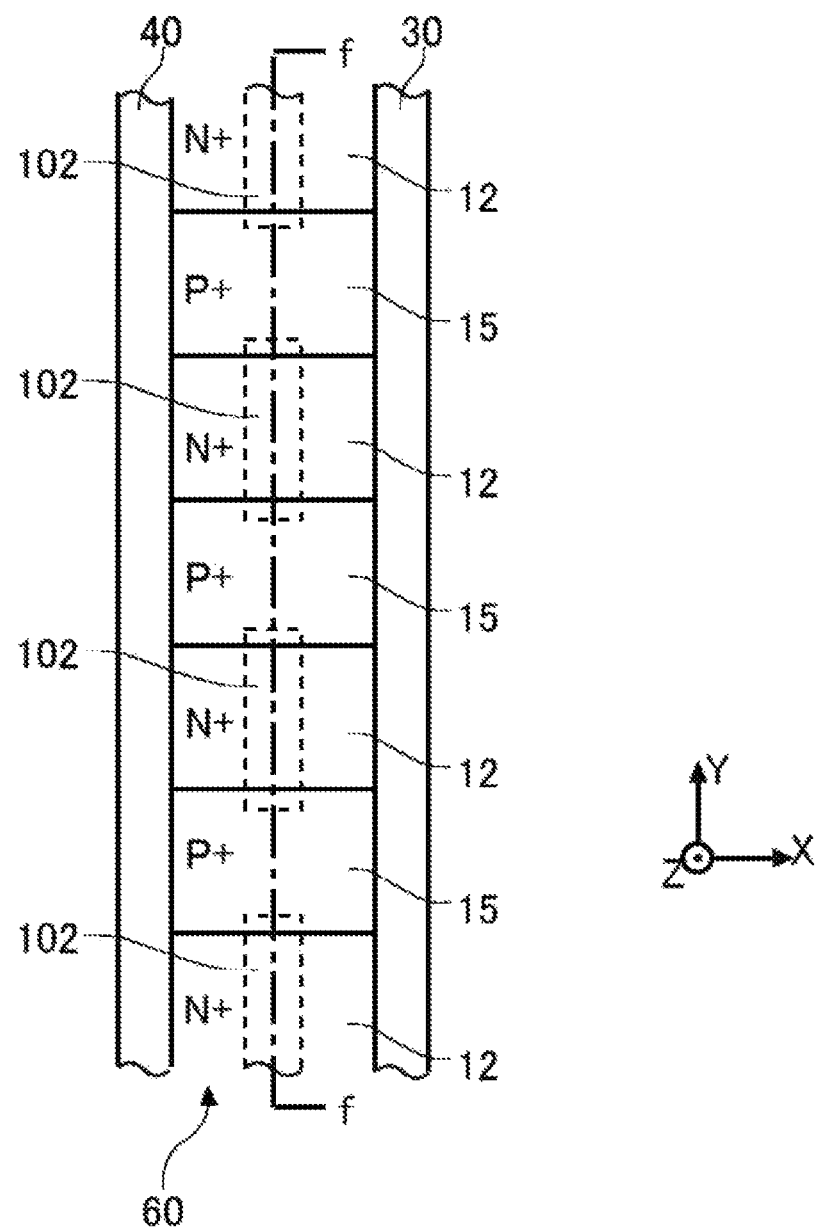
FIG. 14 is a diagram illustrating another arrangement example of an intermediate region 102 in top view.

FIG. 14 is a diagram illustrating another arrangement example of the intermediate region 102 in top view. In FIG. 14, one mesa portion 60 disposed in contact with the gate trench portion 40 is partially illustrated. In FIG. 14, the intermediate region 102 not in contact with the trench portion is illustrated, but the intermediate region 102 may be in contact with the trench portion. As illustrated in FIG. 1, the mesa portion 60 is provided to be extended in the extending direction (Y axis direction) orthogonal to the arranging direction (X axis direction) in the upper surface of the semiconductor substrate 10. In the mesa portion 60 of this example, the emitter region 12 and the contact region 15 are alternately disposed in the extending direction.

The intermediate region 102 of this example is discretely disposed in the extending direction (Y axis direction). Further, the intermediate region 102 is disposed at the center of the mesa portion 60 in the arranging direction (X axis direction). A plurality of intermediate regions 102 may be disposed in a predetermined interval in the extending direction. The intermediate region 102 of this example is disposed to correspond to the emitter region 12 in a one-to-one manner. Each of the intermediate regions 102 is disposed to be overlapped with at least a partial range of the corresponding emitter region 12 in the extending direction (Y axis direction).

In the example illustrated in FIG. 14, the length of each intermediate region 102 in the extending direction is longer than the length of the corresponding emitter region 12 in the extending direction. That is, each intermediate region 102 is provided over the entire range of the corresponding emitter region 12 in the extending direction. In this case, both ends of each intermediate region 102 in the extending direction are disposed at positions overlapped with the contact region 15. However, each intermediate region 102 is disposed not to be overlapped with at least a partial range of the contact region 15 in the extending direction. That is, the contact region 15 has a portion not overlapped with the intermediate region 102 at the center position of the mesa portion 60 in the X axis direction.

When the contact region 15 and the intermediate region 102 are disposed to be overlapped, holes may be excessively extracted to the emitter electrode 52 through the intermediate region 102 and the contact region 15. In this case, the ON voltage of the transistor portion 70 is increased. In this example, the intermediate region 102 is selectively provided at a position overlapped with the emitter region 12, so that the increase of the ON voltage can be suppressed while suppressing the short channel effect.

Further, the arrangement of the intermediate region 102 is not limited to the example of FIG. 14. As illustrated in FIG. 1, the intermediate region 102 may be continuously provided in the extending direction over one or more emitter regions 12 and one or more contact regions 15.

Figure 15:
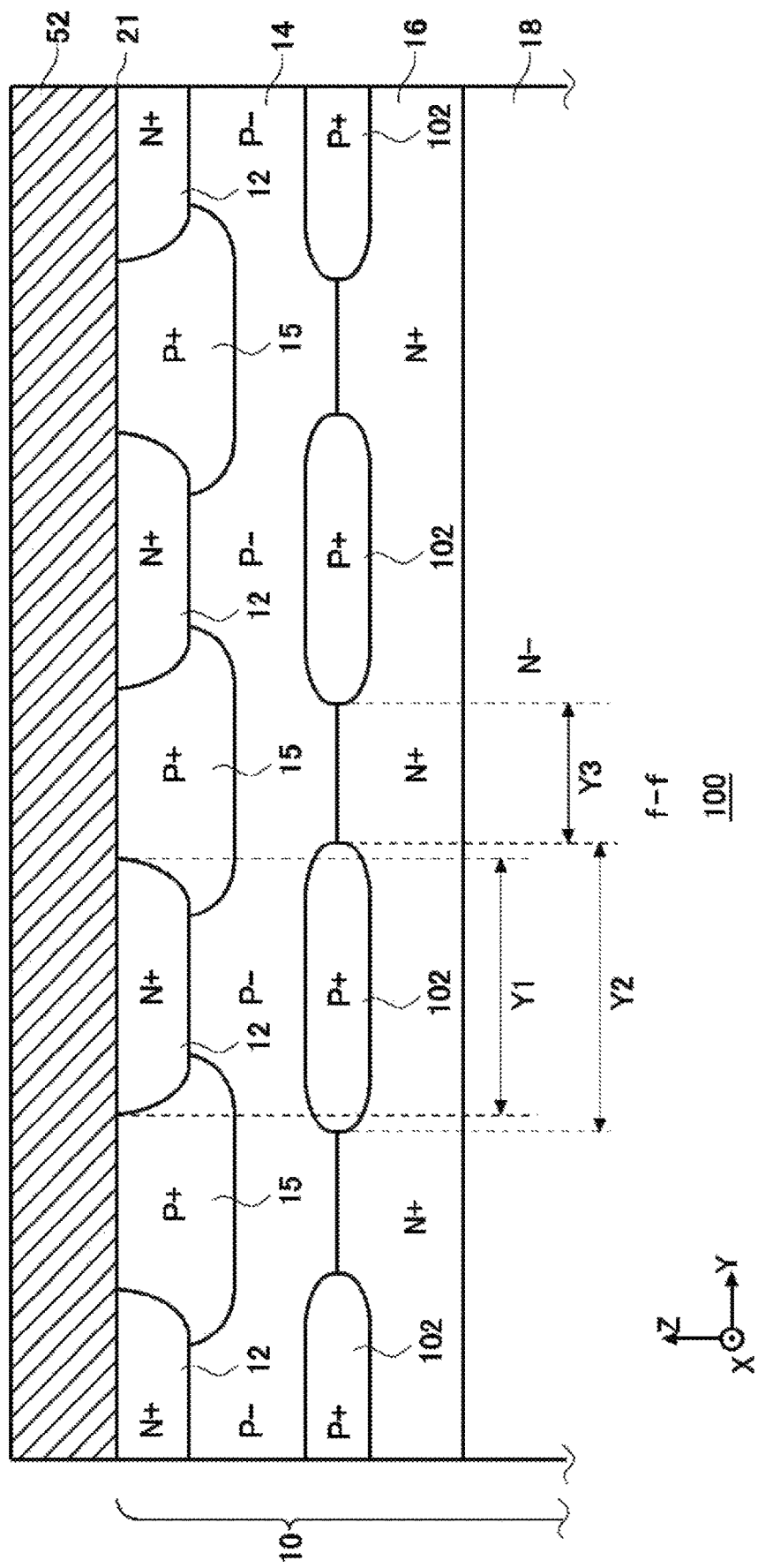
FIG. 15 is a diagram illustrating an example of a cross section taken along a line f-f in FIG. 14.

FIG. 15 is a diagram illustrating an example of a cross section taken along a line f-f in FIG. 14. The f-f cross section is a YZ plane passing through the intermediate region 102. As described in FIG. 14, the intermediate region 102 is provided at a position overlapped with the emitter region 12 in top view. That is, the intermediate region 102 and the emitter region 12 are disposed to face each other in the Z axis direction.

The length of the emitter region 12 in the Y axis direction is Y1, the length of the intermediate region 102 is Y2, and an interval of the intermediate regions 102 is Y3. The length Y2 may be larger than the length Y1. The length Y2 may be equal to or more than 1.1 times the length Y1. The length Y2 may be larger than the length Y3. The length Y2 may be equal to or more than 1.5 times the length Y3, or may be equal to or more than two times.

In the semiconductor substrate 10, the contact region 15 and the intermediate region 102 are disposed apart from each other. In this example, the base region 14 is provided between the contact region 15 and the intermediate region 102. With this configuration, the movement of holes from the intermediate region 102 to the contact region 15 can be suppressed. Therefore, the increase of the ON voltage of the semiconductor device 100 can be suppressed.

In addition, in the semiconductor substrate 10, the emitter region 12 and the intermediate region 102 are disposed apart from each other. In this example, the base region 14 is provided between the emitter region 12 and the intermediate region 102. With this configuration, the short channel effect can be suppressed.

Figure 16:
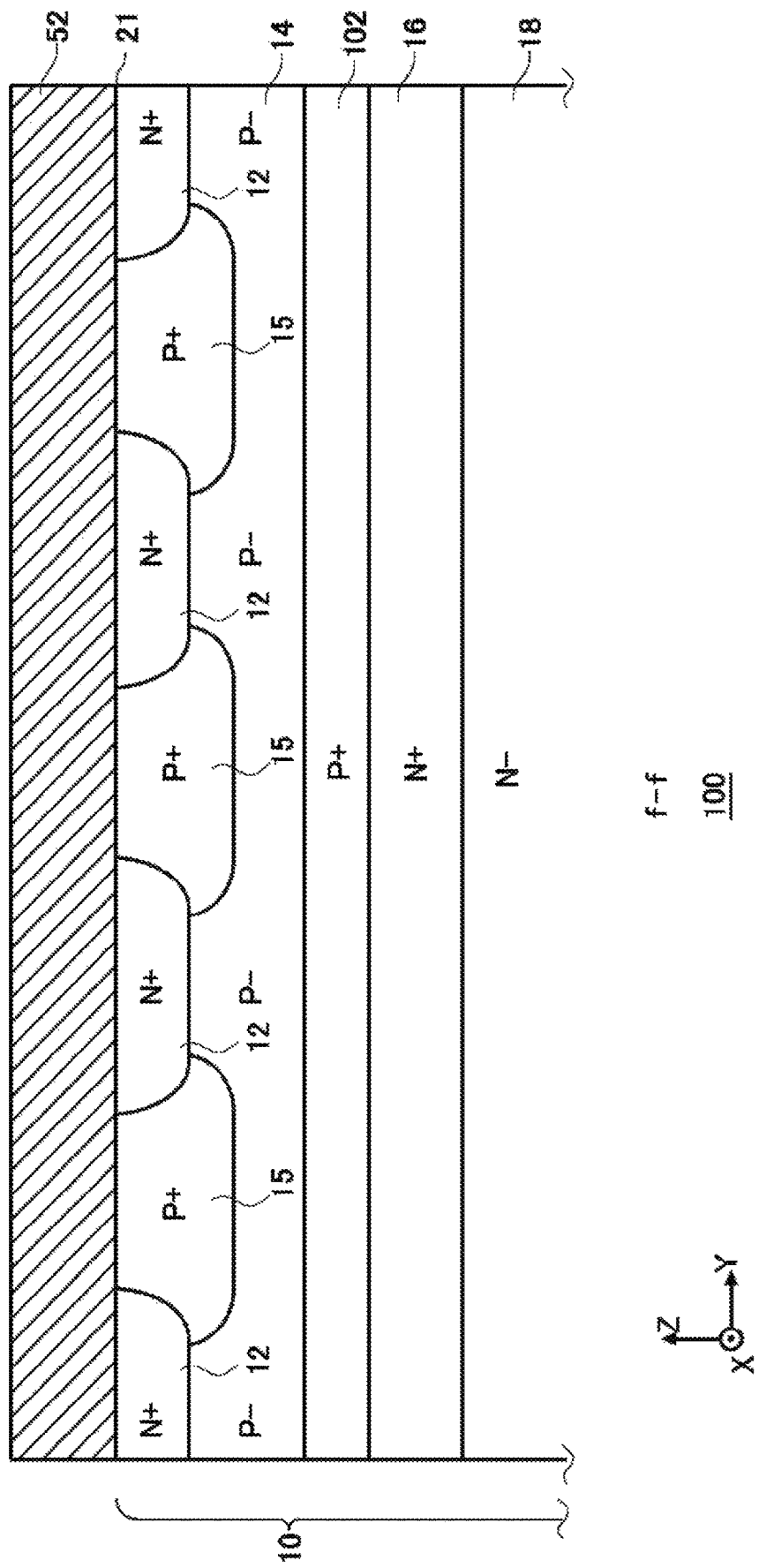
FIG. 16 is a diagram illustrating another example of the cross section taken along a line f-f.

FIG. 16 is a diagram illustrating another example of the cross section taken along a line f-f. The intermediate region 102 in this example is continuously disposed in the Y axis direction as illustrated in FIG. 1. The other configurations are the same as the example illustrated in FIG. 15. With such a configuration, the short channel effect can be suppressed.

Figure 17:
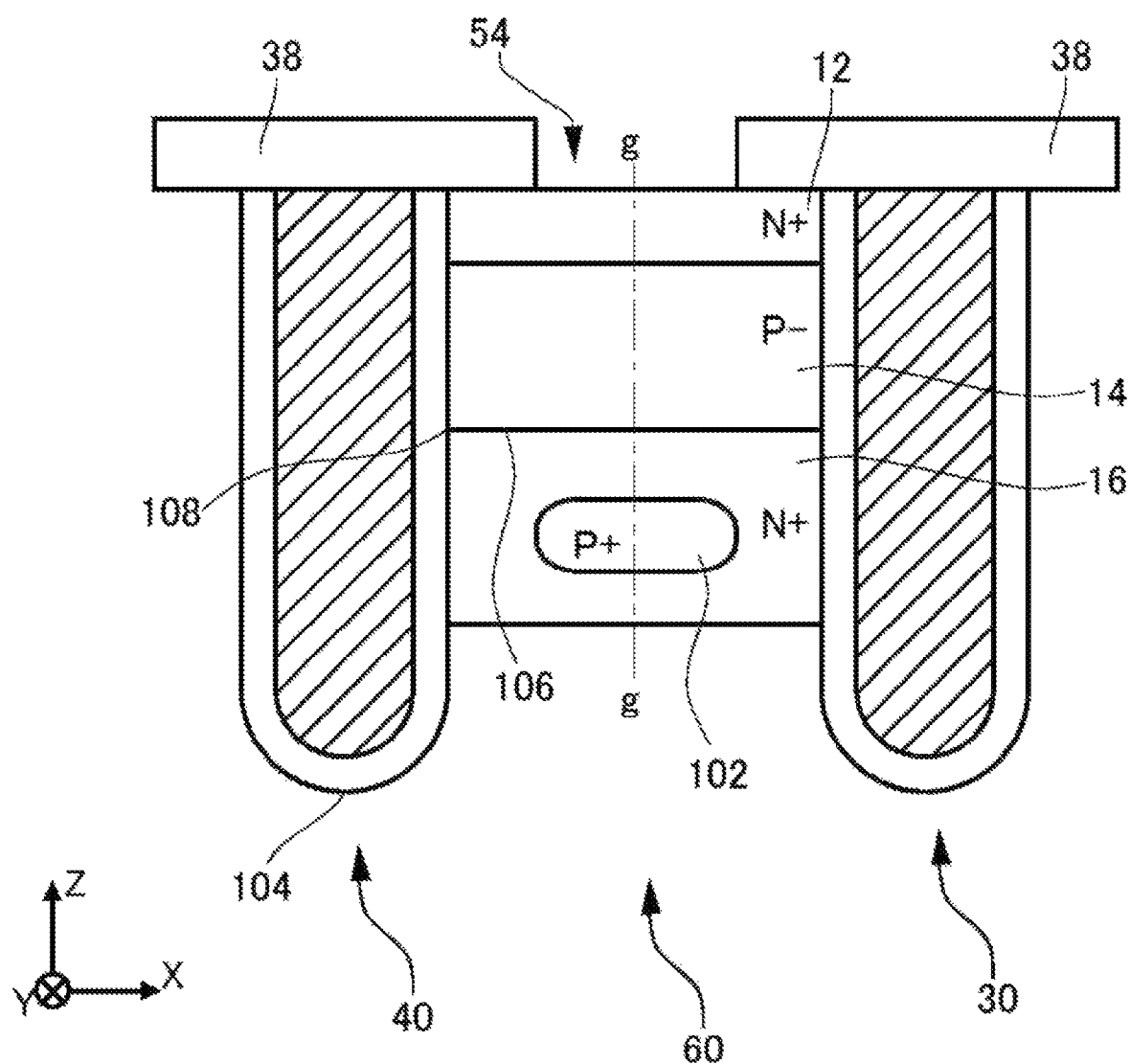
FIG. 17 is an enlarged view illustrating another example of the mesa portion 60.

FIG. 17 is an enlarged view illustrating another example of the mesa portion 60. The mesa portion 60 of this example is different from the example illustrated in FIG. 3 in the arrangement of the intermediate region 102. The structures other than the arrangement of the intermediate region 102 may be the same as any one of the examples described in FIGS. 1 to 16.

The intermediate region 102 of this example is disposed on the lower side from the PN junction 106 of the boundary between the base region 14 and the accumulation region 16. That is, the whole intermediate region 102 is disposed inside the accumulation region 16.

Figure 18:
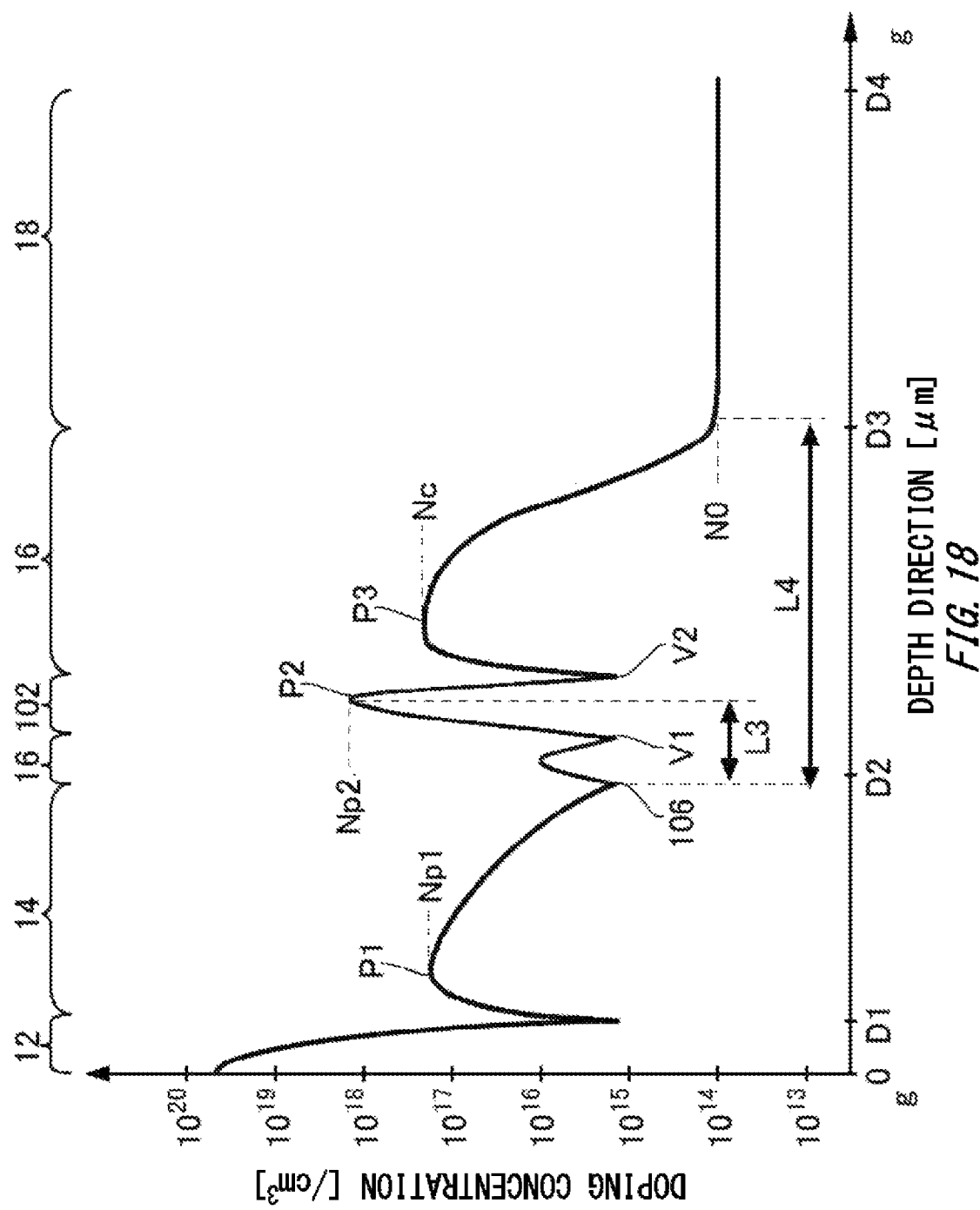
FIG. 18 is a diagram illustrating an example of the doping concentration distribution in line g-g of FIG. 17.

FIG. 18 is a diagram illustrating an example of the doping concentration distribution in a line g-g of FIG. 17. The line g-g is a line which is in parallel with the depth direction (Z axis direction) and passes through the center of the mesa portion 60 in the arranging direction (X axis direction).

The accumulation region 16 is disposed on the upper side and the lower side of the intermediate region 102. The intermediate region 102 is desirably disposed on the upper side from the third peak P3 of the accumulation region 16.

In addition, the distance between the PN junction 106 and the second peak P2 of the intermediate region 102 in the Z axis direction is L3, and the distance between the PN junction 106 and the upper end (that is, the lower end of the accumulation region 16) of the drift region 18 is L4. The distance L3 may be equal to or less than half of the distance L4, or may be equal to or less than ⅓. By setting the distance L3 to be small, the thickness of the accumulation region 16 on the lower side of the intermediate region 102 is secured, and the IE effect is easily maintained.

Figure 19:
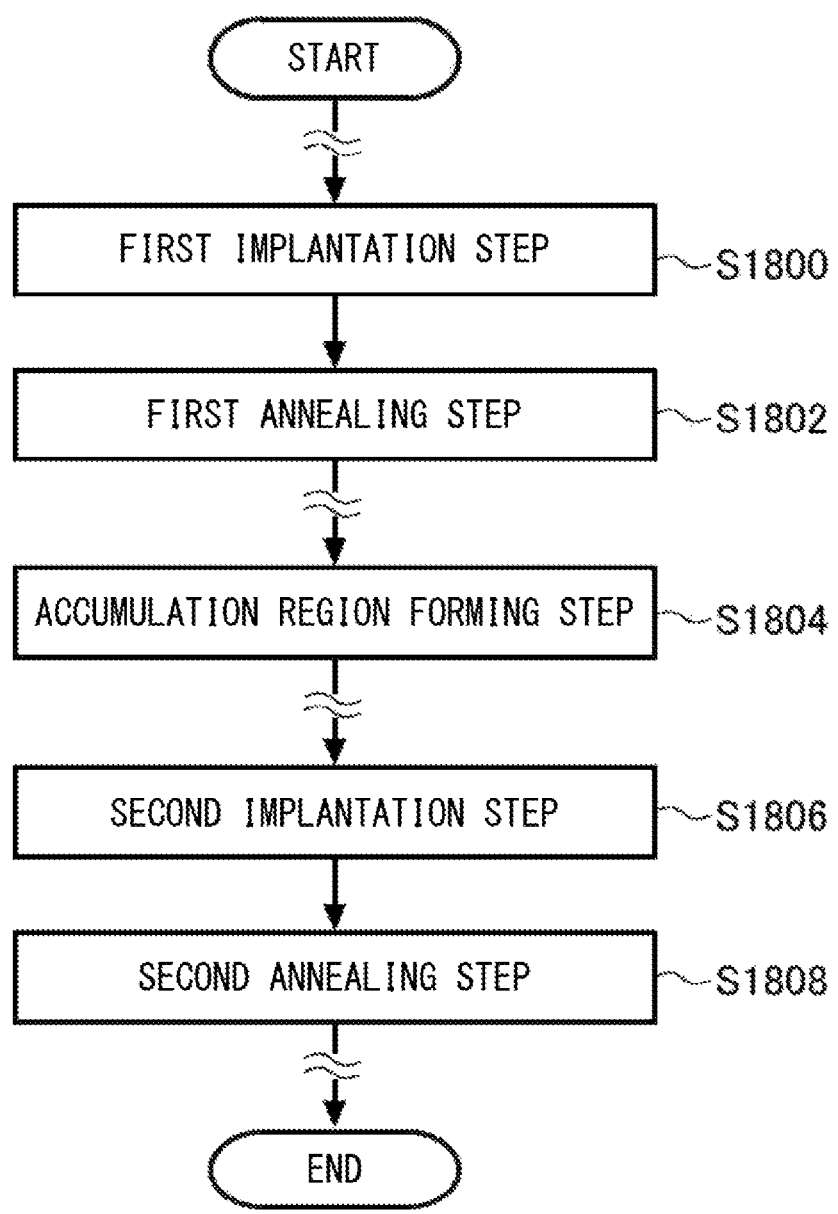
FIG. 19 is a diagram illustrating an example of a manufacturing method of a semiconductor device 100.

FIG. 19 is a diagram illustrating an example of a manufacturing method of the semiconductor device 100. In FIG. 19, steps to form the base region 14, the accumulation region 16, and the intermediate region 102 are illustrated, and other steps are omitted.

The manufacturing method of this example includes a first implantation step S1800 and a first annealing step S1802. In the first implantation step S1800, the dopant of the second conductivity type is implanted to the semiconductor substrate 10 which has the drift region 18. The dopant of the second conductivity type is implanted to a region where the base region 14 is to be formed. The dopant of the second conductivity type is, for example, an ion such as boron. In the first annealing step S1802, the semiconductor substrate 10 is annealed to activate the dopant so as to form the base region 14.

The manufacturing method of this example includes an accumulation region forming step S1804 after the first annealing step S1802. In the accumulation region forming step S1804, the dopant of the first conductivity type is implanted to the semiconductor substrate 10, and the semiconductor substrate 10 is annealed, so that the accumulation region 16 is formed. The dopant of the first conductivity type is, for example, an ion such as hydrogen or phosphorus.

The manufacturing method of this example includes the second implantation step S1806 and the second annealing step S1808 after the accumulation region forming step S1804. In the second implantation step S1806, the dopant of the second conductivity type is implanted to the semiconductor substrate 10. The dopant of the second conductivity type is implanted to a region where the intermediate region 102 is to be formed. The dopant of the second conductivity type is, for example, an ion such as boron. In the second annealing step S1808, the semiconductor substrate 10 is annealed to activate the dopant so as to form the intermediate region 102.

The thermal history in the intermediate region 102 can be reduced by forming the intermediate region 102 after the base region 14. With this configuration, the doping concentration distribution of the intermediate region 102 in the depth direction can be made steeply. Therefore, the influence of the intermediate region 102 on a channel can be reduced while suppressing the short channel effect.

An annealing temperature in the second annealing step S1808 is desirably set to be lower than the annealing temperature in the first annealing step S1802. In addition, an annealing time in the second annealing step S1808 is desirably set to be shorter than the annealing time in the first annealing step S1802. With this configuration, the doping concentration distribution of the intermediate region 102 in the depth direction can be set steeply. As an example, the annealing temperature in the first annealing step S1802 is 1100° C. or more and 1200° C. or less, and the annealing temperature in the second annealing step S1808 is 800° C. or more and 900° C. or less. In addition, the annealing time in the first annealing step S1802 is 1 hour or more and 3 hours or less, the annealing time in the second annealing step S1808 is 5 seconds or more and within 1 minute.

Further, the first annealing step S1802 may indicate an annealing step which is performed at timing closest to the first implantation step S1800 in the annealing step performed after the first implantation step S1800. Similarly, the second annealing step S1808 may indicate an annealing step which is performed at timing closest to the second implantation step S1806 in the annealing step performed after the second implantation step S1806.

In addition, the annealing temperature in the second annealing step S1808 is desirably set to be lower than the annealing temperature in the accumulation region forming step S1804. In addition, the annealing time in the second annealing step S1808 is desirably set to be shorter than the annealing time in the accumulation region forming step S1804. As an example, the annealing temperature in the accumulation region forming step S1804 is 900° C. or more and 1100° C. or less, and the annealing time is 5 minutes or more and 1 hour or less.

With forming of the intermediate region 102, the diffusion of dopant of the accumulation region 16 to the base region 14 can be suppressed in the annealing step after the second implantation step S1806.

Figure 20:
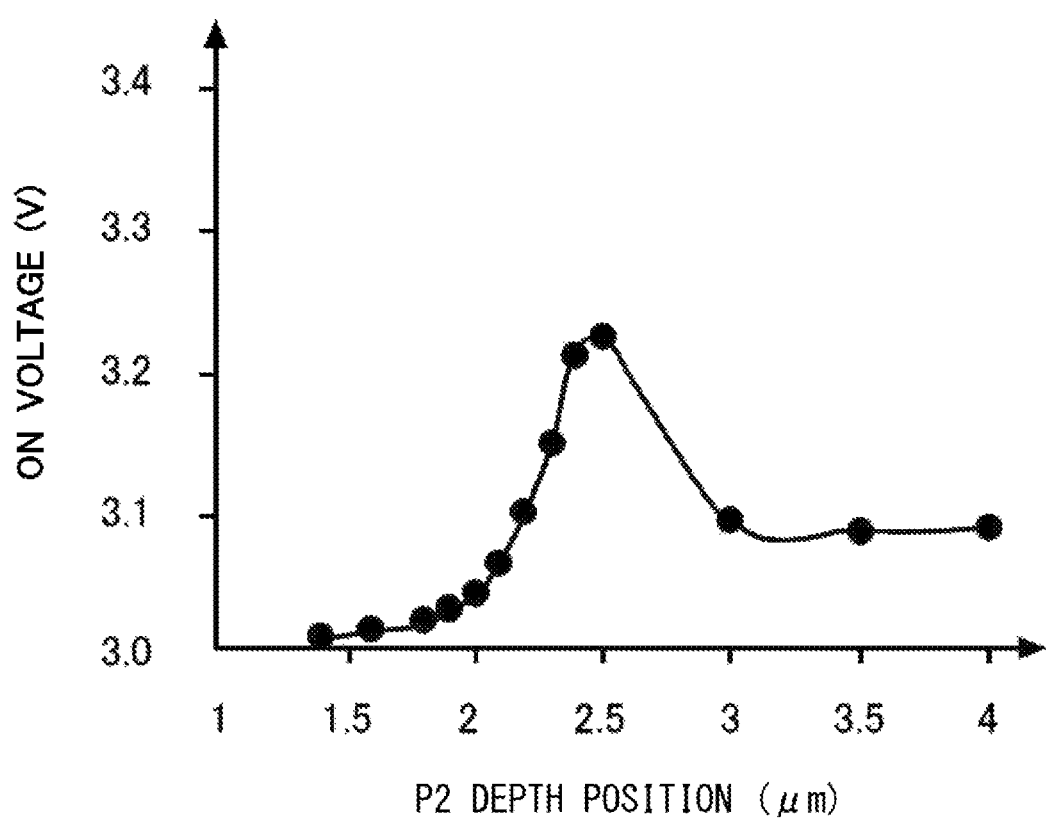
FIG. 20 is a diagram illustrating an example of a relation between a depth position of a second peak P2 of the intermediate region 102 and an ON voltage of the semiconductor device 100.

FIG. 20 is a diagram illustrating an example of a relation between the depth position of the second peak P2 of the intermediate region 102 and the ON voltage of the semiconductor device 100. In this example, the depth position of the PN junction 106 is 2 μm from the upper surface 21 of the semiconductor substrate 10. In addition, the depth position of the third peak P3 of the accumulation region 16 is 2.5 μm. In addition, the ON voltage in a case where the intermediate region 102 is not provided is 3 V.

If the depth position of the second peak P2 is sufficiently shallower than the depth position (2.5 μm) of the third peak P3, even if the intermediate region 102 is provided, the IE effect of the accumulation region 16 will not be reduced so much. Thus, the ON voltage does not increase so much. When the depth position of the second peak P2 is about 0.1 μm deeper than the depth position (2 μm) of the PN junction 106, the ON voltage increases significantly. Then, when the depth position of the second peak P2 becomes the same as the depth position of the third peak P3, the ON voltage becomes a local maximum value.

For this reason, it is desirably that the second peak P2 be disposed at a position shallower than the third peak P3. The second peak P2 may be disposed at a position shallower than the midpoint between the third peak P3 and the PN junction 106 (in this example, a depth of 2.25 μm). The second peak P2 may be disposed within a range of 0.1 μm with respect to the depth position of the PN junction 106. Thereby, the second peak P2 can be separated from both the first peak P1 and the third peak P3.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES 10 semiconductor substrate
11 well region
12 emitter region
14 base region
15 contact region
16 accumulation region
18 drift region
20 buffer region
21 upper surface
22 collector region
23 lower surface
24 collector electrode
25 connection portion
29 extension portion
30 dummy trench portion
31 edge portion
32 dummy insulating film
34 dummy conductive portion
38 interlayer dielectric film
39 extension portion
40 gate trench portion
41 edge portion
42 gate insulating film
44 gate conductive portion
48 gate runner
49 contact hole
50 gate metal layer
52 emitter electrode
54 contact hole
56 contact hole
60 mesa portion
70 transistor portion
80 diode portion
22 cathode region
90 boundary portion
100 semiconductor device
102 intermediate region
104 lower end
106 PN junction
108 end portion
110 tail
112 tail
113 tail
122 kink portion
124 extreme value

What is claimed is:

1. A semiconductor device, comprising:
   a semiconductor substrate which includes a drift region of a first conductivity type;
      a plurality of trench portions which are provided from an upper surface of the semiconductor substrate up to the drift region, and arranged in an arranging direction in the upper surface of the semiconductor substrate; and
      a mesa portion which is a region interposed by two of the trench portions in the semiconductor substrate,
      wherein the trench portions include one or more gate trench portions and one or more dummy trench portions,
      wherein at least one mesa portion in contact with the gate trench portion includes,
      an emitter region, having a first conductivity type of a doping concentration higher than the drift region, which is provided to be exposed to the upper surface of the semiconductor substrate and to be in contact with the gate trench portion,
      a base region, having a second conductivity type, which is provided on a lower side of the emitter region and in contact with on the gate trench portion, an accumulation region, having the first conductivity type of a doping concentration higher than the drift region, which is provided on a lower side of the base region, and an intermediate region, having the second conductivity type, which is provided at a depth position between an upper end of the base region and a lower end of the accumulation region, wherein the base region has a first peak in a doping concentration distribution in a depth direction of the semiconductor substrate, and wherein the intermediate region has at least one of a second peak and a kink portion from the first peak to a depth position of a lower end of the trench portion in a doping concentration distribution in the depth direction.

2. The semiconductor device according to claim 1, wherein, at a depth position where the intermediate region is provided, a doping concentration of a dopant of the second conductivity type of a center of the mesa portion in the arranging direction is higher than a doping concentration of a dopant of the second conductivity type at a position in contact with the trench portion.

3. The semiconductor device according to claim 2, wherein the intermediate region has the second peak, wherein the accumulation region has one or more peaks in the doping concentration distribution in the depth direction of the semiconductor substrate, and wherein the second peak is disposed on an upper side from a peak, which is one of the peaks, on a lowermost side of the accumulation region.

4. The semiconductor device according to claim 3, wherein the second peak is disposed on an upper side from a peak, which is one of the peaks, on an uppermost side of the accumulation region.

5. The semiconductor device according to claim 3, wherein, in a boundary between the base region and the accumulation region, a depth position of a portion in contact with the gate trench portion is within a half-width range of the doping concentration distribution of the intermediate region with reference to a depth position of the second peak.

6. The semiconductor device according to claim 3, wherein at least a part of the intermediate region is provided on an upper side from a depth position of a portion in contact with the gate trench portion in a boundary between the base region and the accumulation region.

7. The semiconductor device according to claim 3, wherein a doping concentration of the second peak is higher than a doping concentration of the first peak.

8. The semiconductor device according to claim 3, wherein a doping concentration of the second peak is higher than a doping concentration of the accumulation region.

9. The semiconductor device according to claim 3, wherein a doping concentration distribution in a depth direction on a lower side from the second peak of the intermediate region is more steeply changed than a doping concentration distribution in a depth direction on a lower side from the first peak of the base region.

10. The semiconductor device according to claim 3, wherein a doping concentration distribution in a depth direction on an upper side from the second peak of the intermediate region is more steeply changed than a doping concentration distribution in a depth direction on a lower side from the first peak of the base region.

11. The semiconductor device according to claim 3, wherein the intermediate region is disposed in contact with the gate trench portion, and wherein a doping concentration of the second peak at a position in contact with the gate trench portions is lower than a doping concentration of the first peak.

12. The semiconductor device according to claim 1, wherein the intermediate region is disposed apart from the gate trench portions.

13. The semiconductor device according to claim 12, wherein the intermediate region is provided across a boundary between the base region and the accumulation region, and has an upper end in contact with the base region.

14. The semiconductor device according to claim 1, wherein the mesa portion is provided to be extended in an extending direction orthogonal to the arranging direction in the upper surface of the semiconductor substrate, wherein the mesa portion includes a contact region of the second conductivity type of a doping concentration higher than the base region, which is disposed to be exposed to the upper surface of the semiconductor substrate alternately with the emitter region in the extending direction, and wherein the intermediate region is disposed to be overlapped with at least a partial range of the emitter region in the extending direction, and not to be overlapped with at least a partial range of the contact region in the extending direction.

15. The semiconductor device according to claim 14, wherein a length of the intermediate region in the extending direction is longer than a length of the emitter region in the extending direction.

16. The semiconductor device according to claim 14, wherein the contact region and the intermediate region are disposed apart from each other in the semiconductor substrate.

17. The semiconductor device according to claim 14, wherein the emitter region and the intermediate region are disposed apart from each other in the semiconductor substrate.

18. The semiconductor device according to claim 1, wherein at least a part of the intermediate region is disposed in the mesa portion which is interposed by the gate trench portion and the dummy trench portion, and wherein the intermediate region is disposed apart from the dummy trench portion.

19. A manufacturing method for manufacturing the semiconductor device according to claim 1, comprising:

a first implantation step to implant a dopant of a second conductivity type to the semiconductor substrate which has the drift region;

a first annealing step to anneal the semiconductor substrate to form the base region;

a second implantation step to implant a dopant of the second conductivity type to the semiconductor substrate after the first annealing step; and a second annealing step to anneal the semiconductor substrate at a temperature lower than the first annealing step to form the intermediate region.

20. The manufacturing method according to claim 19, wherein an annealing time of the second annealing step is shorter than an annealing time of the first annealing step.

21. The manufacturing method according to claim 19, comprising:
    a step to form the accumulation region, between the first annealing step and the second implantation step, in which a dopant of the first conductivity type is implanted to the semiconductor substrate to anneal the semiconductor substrate.

22. The manufacturing method according to claim 21,
    wherein an annealing temperature of the second annealing step is lower than an annealing temperature of the step to form the accumulation region, and
wherein an annealing time of the second annealing step is shorter than an annealing time of the step to form the accumulation region.

\* \* \* \* \*